United States Patent [19]

(12) United States Patent
Lia et al.

(10) Patent No.: US 9,379,723 B2
(45) Date of Patent: Jun. 28, 2016

(54) METHOD AND APPARATUS FOR GENERATING A DIGITAL SIGNAL OF TUNABLE FREQUENCY AND FREQUENCY SYNTHESIZER EMPLOYING SAME

(75) Inventors: Enrico Lia, Leiderdorp (NL); Andreas Lauer, Neukirchen-Vluyn (DE); Dietmar Koether, Duisburg (DE); Rüdiger Follmann, Mettmann (DE)

(73) Assignee: EUROPEAN SPACE AGENCY, Paris (FR)

( * ) Notice: Subject to any disclaimer, the term of this patent is extended or adjusted under 35 U.S.C. 154(b) by 0 days.

(21) Appl. No.: 14/399,104

(22) PCT Filed: May 11, 2012

(86) PCT No.: PCT/EP2012/058754
§ 371 (c)(1),
(2), (4) Date: Nov. 5, 2014

(87) PCT Pub. No.: WO2013/167196
PCT Pub. Date: Nov. 14, 2013

(65) Prior Publication Data
US 2015/0109029 A1    Apr. 23, 2015

(51) Int. Cl.
*H03K 3/00*      (2006.01)
*H03L 7/197*     (2006.01)
*H03L 7/097*     (2006.01)

(52) U.S. Cl.
CPC .............. *H03L 7/1974* (2013.01); *H03L 7/097* (2013.01)

(58) Field of Classification Search
CPC .......... H03L 7/097; H03L 7/1974; H03L 7/24
USPC .......... 327/105, 107, 165, 166, 167, 291, 299
See application file for complete search history.

(56) References Cited

U.S. PATENT DOCUMENTS

| 7,746,181 B1 | 6/2010 | Moyal |
| 2004/0012423 A1 | 1/2004 | Maeda |
| 2004/0242175 A1 | 12/2004 | Lin |

(Continued)

FOREIGN PATENT DOCUMENTS

| EP | 1 164 701 A2 | 12/2001 |
| JP | 2004-056409 A | 2/2004 |

(Continued)

OTHER PUBLICATIONS

Aug. 5, 2013 Search Report issued in International Patent Application No. PCT/EP2012/058754.

(Continued)

*Primary Examiner* — William Hernandez
(74) *Attorney, Agent, or Firm* — Oliff PLC

(57) ABSTRACT

A method for generating a digital signal of tunable frequency may include generating a periodic first analog signal, determining a sign of a first difference between a value of the first analog signal and a first control value to determine sign flips, wherein the first control value is a variable value, and generating the digital signal of tunable frequency on the basis of the determined sign of the first difference, wherein the digital signal of tunable frequency is generated such that a subset of switches of the signal level are coincident with a respective sign flip of the determined sign of the first difference.

20 Claims, 14 Drawing Sheets

(56) References Cited

U.S. PATENT DOCUMENTS

| | | | |
|---|---|---|---|
| 2007/0035350 A1* | 2/2007 | Bollenbeck | H03J 7/065 331/53 |
| 2010/0052760 A1 | 3/2010 | Fujiwara | |
| 2010/0171532 A1 | 7/2010 | Tajima et al. | |
| 2012/0249196 A1* | 10/2012 | Akaike | G06F 1/022 327/156 |

FOREIGN PATENT DOCUMENTS

| | | |
|---|---|---|
| JP | 2004-253902 A | 9/2004 |
| JP | 2010-056594 A | 3/2010 |
| WO | 2007/091516 A1 | 8/2007 |

OTHER PUBLICATIONS

Aug. 5, 2013 Written Opinion issued in International Patent Application No. PCT/EP2012/058754.

Zanuso et al; "A Wideband 3.6 GHz Digital $\Delta\Sigma$ Fractional-N PLL With Phase Interpolation Divider and Digital Spur Cancellation;" IEEE Journal of Solid-State Circuits; Mar. 2011; vol. 46, No. 3; pp. 627-638.

Jan. 6, 2016 Office Action issued in Japanese Patent Application No. 2015-510658.

* cited by examiner

METHOD AND APPARATUS FOR GENERATING A DIGITAL SIGNAL OF TUNABLE FREQUENCY AND FREQUENCY SYNTHESIZER EMPLOYING SAME

TECHNICAL FIELD OF THE INVENTION

The present invention relates to a method and an apparatus for generating a digital signal of tunable frequency, such as a reference clock signal of tunable frequency.

The invention is particularly though not exclusively applicable to generating a reference clock signal for a fractional-N frequency synthesizer and to operating a fractional-N frequency synthesizer on the basis of the reference clock signal.

BACKGROUND OF THE INVENTION

Frequency synthesizers are commonly used to generate signals of a desired frequency, e.g. in the field of terrestrial communication or satellite communication. A widespread type of a frequency synthesizer is a fractional-N phase lock loop (PLL) frequency synthesizer, which allows for a very high frequency resolution. A typical configuration of such a fractional-N frequency synthesizer is illustrated in FIG. 1. The fractional-N frequency synthesizer 100, according to FIG. 1 comprises a reference clock generator 101, a digital core 102, a phase frequency detector (PFD) 103, a charge pump 104, a loop filter 105, a voltage controlled oscillator (VCO) 106, a divide-by-2 pre-scaler 107, a ⅘ divider 108, an M-counter 109 serving as a fractional-N divider, and an A-counter 110. An output signal of the VCO 106 is pre-scaled by the divide-by-2 pre-scaler 107 and the ⅘ divider 108, and fed to the fractional-N divider 109. In the fractional-N divider 109, the frequency of the signal is divided down by a fractional number N, and the output of the fractional-N divider 109 is fed to the PFD 103. In the PFD 103, a reference clock signal output by the reference clock generator 101 and processed in the digital core 102 is compared to the output of the fractional-N divider 109 with regard to its phase and frequency. The PFD 103 compares e.g. the up- or down-slopes of the respective two input signals and outputs a voltage signal indicative of a phase difference of the respective up- or down-slopes, wherein the polarity of the output voltage of the PFD 103 indicates the sign of the phase difference. In other words, the polarity of the output voltage of the PFD 103 indicates the temporal order of the respective up- or down-slopes. The signal output by the PFD 103 is converted to a current by the charge pump 104, and the generated current is input to a loop filter 105 in which it is integrated to form a voltage control signal for the VCO 106. By the phase lock loop formed by the PFD 103, the charge pump 104, the loop filter 105, the VCO 106, the divide-by-2 pre-scaler 107, the ⅘ divider 108, and the fractional-N divider 109, the output frequency of the VCO 106 is controlled so that the pre-scaled and divided output signal of the VCO 106 has the same frequency as the reference clock signal output by the reference clock generator 101 and processed by the digital core 102.

In the above, the dividing down of the frequency of the output signal of the VCO 106 by the fractional-N divider 109 is achieved as follows. If N would be set to an integer division ratio, the fractional-N divider 109 would output a pulse for every N subsequent pulses input to the fractional-N divider 109. Then, each N-th pulse is fed to the PFD 103, and the division ratio N is fed to the digital core 102, so that the reference clock signal output by the reference clock generator 101 may be processed accordingly. In particular, the reference clock signal is processed so that the digital core 102 outputs a pulse of the reference clock signal only in a timing interval in which also an N-th pulse is expected to be output by the fractional-N divider 109. In other words, by the above configuration, every N-th pulse of the pre-scaled output signal of the VCO 106 is compared to a respective pulse of the reference clock signal. In a simplified example, in which the divide-by-2 pre-scaler 107 and the ⅘ divider 108 are omitted, the frequency of the output signal of the VCO 106 in this manner is controlled to be equal to N times the frequency of the reference clock signal output by the reference clock generator 101.

Fractional division ratios may be obtained by alternatingly setting the fractional-N divider 109 to different integer division ratios. For example, a resulting/desired division ratio of 10.5 may be obtained by alternatingly setting the actual/momentary division ratio N of the fractional-N divider 109 to 10 and to 11. According to a further example, a resulting division ratio of 10.1 may be obtained by setting the actual division ratio to 11 for one out of 10 cycles of the fractional-N divider 109, and to 10 for the remaining nine out of 10 cycles. Of course, more elaborate schemes for setting the integer division ratios may be employed, such as for instance a scheme in which the relative occurrence of integer division ratios is determined by a distribution such as a Gauss-distribution centered on the desired fractional division ratio. Accordingly, in the example in which the fractional division ratio is desired to be 10.5, integer division ratios 11, 12, 13 etc. with decreasing relative occurrence, and integer division ratios 10, 9, 8, etc. with decreasing relative occurrence may be set.

With a fractional-N frequency synthesizer as described above, however, the problem occurs that the two signals that are compared at the PFD are never exactly in phase. That is, in a cycle of the fractional-N divider 109 in which the actual division ratio of the fractional-N divider 109 is set to an integer value below the desired fractional division ratio, the reference clock signal lags behind the output of the fractional-N divider 109, whereas for a cycle in which the actual division ratio the fractional-N divider 109 is set to an integer value above the desired fractional division ratio, the signal output by the fractional-N divider 109 lags behind the reference clock signal. Accordingly, the output voltage of the PFD 103 frequently changes polarity, so that also the current to be output by the charge pump frequently changes polarity. However, on occurrence of a flip of polarity of the current, the current is momentarily very small, and due to the characteristics of the charge pump 104 the magnitude of the current changes non-linearly in this regime. Also, the time dependence of the output current is unpredictable in this case. For this reason, this regime of the charge pump 104 is referred to as "non-linear zone" or "dead zone". This non-linear change of the magnitude of the current output by the charge pump 104, and the unpredictable time-dependence influences the VCO 106, so that the output signal of the VCO 106 comprises unwanted spurious frequency components referred to as "spurs". Since these spurs are due to the operation of the fractional-N divider 109, these spurs are referred to as "fractional spurs".

Fractional spurs occur if the desired division ratio N is close to an integer or close to a half-integer. It is found that fractional spurs occur for approximately 16% of the frequency space of the output signal, or respectively for approximately 16% of the space of desired division ratios N. Thus, in the following, desired division ratios N that are in the interval $n-0.05 < N < n+0.05$ or in the interval $(n+½)-0.05 < N < (n+½)+0.05$, where n is zero or a positive integer, will be referred as "spur critical". Desired division ratios N that are not in these intervals will be referred to as "spur free" values.

Further sources of spurs are the coupling-back of the output signal of the VCO 106 to the reference clock signal or vice versa, especially if the frequency synthesizer is realized in a single-chip configuration, a potential charge pump mismatch or a potential charge pump leakage.

In the prior art, different mechanisms to reduce the level of fractional spurs are known, and include dithering, noise shaping in the PFD, and applying an offset current (bias) to the charge pump, wherein the latter will suppress fractional spurs at the price of an increased phase noise. However, neither of these mechanisms is known to completely remove fractional spurs. Also, especially for fractional-N frequency synthesizers implemented on a single chip, means for reducing the level of fractional spurs are limited due to design considerations and space limitations.

Publication "*A wideband 3.6 GHz digital DS fractional-N PLL with phase interpolation divider and digital spur cancellation*" by Zanuso, M. et al., IEEE Journal of Solid-State Circuits, Vol. 46, No. 3, March 2011, pages 627-638, discloses a fractional-N frequency synthesizer, in which the PFD is replaced by a time-to-digital converter (TDC) and which employs a phase-interpolator-based fractional-N divider. However, reducing the level of fractional spurs by means of a phase interpolation divider will increase phase noise, and active loop filtering is required.

Also, hybrid fractional-N frequency synthesizers are proposed in which the frequency of the reference signal may be adjusted such that spur-critical values of the division ratio N may be avoided. In such hybrid fractional-N frequency synthesizers, the reference clock signal is provided by a direct digital synthesizer (DDS), for which the output frequency may be tuned. In the DDS, a pre-stored signal sequence (e.g. a sine wave) is sampled with an adjustable sample rate, and the resulting sequence of signal values is subjected to digital-to-analog conversion to generate an output signal of a desired frequency. Therein, the desired frequency depends on the sample rate. However, due to sampling errors and digital-to-analog conversion, the output signal of the DDS is not spur-free. Accordingly, also the output of a hybrid fractional-N frequency synthesizer is not spur-free.

SUMMARY OF THE INVENTION

It is an object of the present invention to overcome the limitations of the prior art discussed above. It is another object of the invention to provide a signal generator outputting a digital signal of tunable frequency with a reduced spur level. It is a further object of the invention to provide a fractional-N frequency synthesizer outputting a signal with a reduced spur level. It is yet a further object of the present invention to provide a fractional-N frequency synthesizer that outputs a signal with a reduced spur level and that may be implemented on a single chip.

In view of the above objects, a method for generating a digital signal of tunable frequency having the features of appended claim 1 and a signal generator having the features of appended claim 10 are proposed. Preferred embodiments are described in the dependent claims.

According to a preferred embodiment of the invention, the inventive method is employed for generating a reference clock signal for a frequency synthesizer. According to another preferred embodiment of the invention, the inventive signal generator is employed in a frequency synthesizer.

According to an aspect of the invention, a method for generating a digital signal of tunable frequency is provided, the method comprising: generating a periodic first analog signal, determining a sign of a first difference between a value of the first analog signal and a first control value to determine sign flips, wherein the first control value is a variable value, and generating the digital signal of tunable frequency on the basis of the determined sign of the first difference, wherein the digital signal of tunable frequency is generated such that a subset of switches of the signal level are coincident with a respective sign flip of the determined sign of the first difference. Preferably, the first analog signal is generated on the basis of a periodic reference signal.

The inventive method provides for a strict separation of the analog domain from the digital domain. As the inventors have realized, since spurs have their origin in the digital domain, such separation allows significantly limiting the overall spur level of the final digital output signal. By the proposed method, a periodic analog signal is compared to a threshold indicated by a variable control value. This comparison is performed exclusively in the analog domain, so that a signal that results from the comparison is spur-free. Accordingly, the signal for which a subset of switches of the signal level coincides with respective sign flips of a first difference between a value of the analog signal and the variable control value is strictly spur-free.

By providing a variable control value, the timing at which the sign of the determined first difference flips may be varied from one period of the analog signal to another. Thus, the timings of the switches of the signal level of the digital signal of tunable frequency may be adjusted. In other words, by providing a variable control value, the frequency of the digital signal of tunable frequency may be almost arbitrarily tuned. In summary, the inventive method allows to provide a digital signal having a tunable frequency that is free of spurs and does not require any up-multiplication of the digital input signal for oversampling purpose.

It is further proposed to adjust the first control value for each period of the first analog signal. If the first analog signal is generated on the basis of the periodic reference signal, the first control value may alternatively be adjusted for each period of the reference signal.

If the first control value is adjusted for each period of the first analog signal or each period of the reference signal, respectively, a digital signal having a constant frequency may be generated, and the frequency of the digital signal may be accurately and almost arbitrarily tuned.

Preferably, generating the first analog signal further comprises periodically performing a first integration operation to obtain a first integration value, and the first analog signal is indicative of the first integration value. In particular, generating the first analog signal may further comprise periodically charging a first capacitor, in which case the first analog signal is indicative of a voltage of the first capacitor.

In this way, a spur-free analog signal may be generated by economic and simple means. In particular, if a constant gain of the integration operation or a constant charging current, respectively, is provided, the resulting first analog signal is a triangular signal, which allows for a simple and accurate tuning of the frequency of the digital signal, involving only a relatively simple computation.

It is further proposed that in the step of generating the signal of tunable frequency, the digital signal of tunable frequency is generated such that each of the remaining switches of the signal level is performed a predetermined period of time after a respective opposite switch of the signal level.

Especially in cases in which the digital signal of tunable frequency is used for triggering only on e.g. the up-slopes, the above-proposed feature provides for a particularly simple implementation of the inventive method. If those switches of the signal level that are not coincident with a respective sign flip of the determined first difference are performed at a predetermined period of time after the respective preceding switch of the signal level of opposite direction, said switching may be implemented by a mono-flop.

According to another aspect of the invention, it is proposed to further generate a periodic second analog signal, wherein the second analog signal has a fixed phase shift with respect to the first analog signal, and to determine a sign of a second difference between a value of the second analog signal and a second control value to determine sign flips, wherein the second control value is a variable value, wherein in the step of generating the signal of tunable frequency, the digital signal of tunable frequency is further generated on the basis of the determined sign of the second difference such that each of the remaining switches of the signal level are coincident with a respective sign flip of the determined sign of the second difference. Preferably, the second analog signal is generated on the basis of the periodic reference signal. Further preferably, the fixed phase shift is 180 degrees, and the second analog signal is generated on the basis of an output of a logical NOT-gate for shifting the phase of the first reference signal by 180 degrees.

By providing a second analog signal with a fixed phase shift with respect to the first analog signal, a simple and accurate trigger for the remaining switches of the signal level that are not triggered by the first analog signal may be provided. Since also the second control value is variable, the timings of these switches of signal level may be varied from one period of the first analog signal to another. Thereby, a duty ratio of the digital signal of tunable frequency may be accurately adjusted. Moreover, by splitting the reference signal into a signal identical to the reference signal and a signal that is shifted by 180 degrees from the reference signal, both the first analog signal and the second analog signal may be generated in a particularly simple way, with an ensured fixed phase difference between the first analog signal and the second analog signal.

It is further proposed to adjust the second control value for each period of the first analog signal. If the first analog signal is generated on the basis of the periodic reference signal, the second control value may alternatively be adjusted for each period of the reference signal.

If the second control value is adjusted for each period of the first analog signal or for each period of the reference signal, respectively, a digital signal having a constant frequency and a constant duty ratio may be generated, and the frequency of the digital signal as well as the duty ratio may be accurately and almost arbitrarily tuned.

Preferably, generating the second analog signal further comprises periodically performing a second integration operation to obtain a second integration value, and the second analog signal is indicative of the second integration value. In particular, generating the second analog signal further comprises periodically charging a second capacitor, in which case the second analog signal is indicative of a voltage of the first capacitor.

In this way, a spur-free analog signal may be generated by economic and simple means. In particular, if a constant gain of the integration operation or a constant charging current, respectively, is provided, the resulting second analog signal is a triangular signal, which allows for a simple and accurate tuning of the frequency and/or duty ratio of the digital signal, involving only a relatively simple computation.

According to another aspect, it is proposed to further use the digital signal of tunable frequency as a reference clock signal for a frequency synthesizer, wherein the frequency synthesizer comprises a voltage controlled oscillator for generating an output signal, a fractional-N divider for generating a divided output signal on the basis of the output signal, a phase comparator for generating a control signal indicative of a phase difference between the divided output signal and the reference clock signal, and a filter for generating a filtered control signal on the basis of the control signal, and wherein the voltage controlled oscillator is controlled on the basis of the filtered control signal.

The spur-free digital signal of tunable frequency may be advantageously employed as a reference clock signal for a fractional-N frequency synthesizer. Since the frequency of the reference clock signal may be almost arbitrarily tuned, additional choices for the division ratio of the fractional-N divider become available for a given desired frequency of the output signal of the frequency synthesizer. Clearly, such additional choices are not available for a fixed frequency of the reference clock signal. In addition, the reference clock signal that is provided in the inventive fractional-N frequency synthesizer is spur-free.

Therefore, values of the fractional division ratio that would result in fractional spurs, in particular fractional division ratios close to an integer or close to a half-integer, can be avoided. In particular, it is now also possible to limit the division ratio of the fractional-N divider to strictly integer values, so that, for a desired frequency of the output signal, no switching of the fractional-N divider is necessary. In this way, the level of fractional spurs of the fractional-N frequency synthesizer may be significantly reduced. Thus, the inventive frequency synthesizer combines the advantages of a fractional-N frequency synthesizer and an integer-N frequency synthesizer, namely excellent frequency resolution and absence of fractional spurs.

It is further proposed to set a division ratio of the fractional-N divider, and to control the frequency of the digital signal of tunable frequency in accordance with a desired frequency of the output signal and the set division ratio of the fractional-N divider. Preferably, the division ratio of the fractional N-divider is set to spur free values regardless of the desired frequency of the output signal. In particular, the division ratio of the fractional N-divider is preferably set to values that are neither close to an integer nor close to a half-integer. Notably, the division ratio of the fractional-N divider may be set to an integer value, so that no switching of the fractional-N divider is necessary.

According to another aspect of the invention, a signal generator for generating a digital signal of tunable frequency is proposed, the signal generator comprising means for generating a periodic first analog signal, means for determining a sign of a first difference between a value of the first analog signal and a first control value to determine sign flips, wherein the first control value is a variable, value, and means for generating the digital signal of tunable frequency on the basis of the determined sign of the first difference, configured to switch the signal level of the digital signal of tunable frequency such that a subset of switches of the signal level are coincident with a respective sign flip of the determined sign of the first difference. Preferably, the first analog signal is generated on the basis of a periodic reference signal.

Further, it is proposed to provide means for adjusting the first control value for each period of the first analog signal. If the first analog signal is generated on the basis of the periodic reference signal, the first control value may alternatively be adjusted for each period of the reference signal.

Preferably, the means for generating the first analog signal is further configured to periodically perform a first integration operation to obtain a first integration value, and the first analog signal is indicative of the first integration value. In particular, the means for generating the first analog signal may be further configured to periodically charge a first capacitor, in which case the first analog signal is indicative of a voltage of the first capacitor.

According to another aspect of the invention, it is proposed to further provide means for generating a periodic second analog signal, wherein the second analog signal has a fixed phase shift with respect to the first analog signal, and means for determining a sign of a second difference between a value of the second analog signal and a second control value to determine sign flips, wherein the second control value is a variable value, wherein the means for generating the digital signal of tunable frequency is further configured to generate the digital signal of tunable frequency on the basis of the determined sign of the second difference, and to switch the signal level of the digital signal of tunable frequency such that each of the remaining switches of the signal level are coincident with a respective sign flip of the determined sign of the second difference. Preferably, the second analog signal is generated on the basis of the periodic reference signal. Further preferably, the fixed phase shift is 180 degrees, and the second analog signal is generated on the basis of an output of a logical NOT-gate for shifting the phase of the first reference signal by 180 degrees.

Preferably, the means for generating the second analog signal is further configured to periodically perform a second integration operation to obtain a second integration value, and the second analog signal is indicative of the second integration value. In particular, the means for generating the second analog signal may be further configured to periodically charge a second capacitor, in which case the second analog signal is indicative of a voltage of the second capacitor.

According to yet another aspect of the invention, a frequency synthesizer with a voltage controlled oscillator for generating an output signal, a fractional-N divider for generating a divided output signal on the basis of the output signal, a phase comparator for generating a control signal indicative of a phase difference between the divided output signal and a reference clock signal, a filter for generating a filtered control signal on the basis of the control signal, wherein the voltage controlled oscillator is controlled on the basis of the filtered control signal, and the signal generator is proposed, wherein the reference clock signal is the digital signal of adjustable frequency generated by the signal generator.

It is further proposed to provide the frequency synthesizer with means for setting a division ratio of the fractional-N divider, and means for controlling the frequency of the digital signal of tunable frequency in accordance with a desired frequency of the output signal and the set division ratio of the fractional-N divider. Preferably, the division ratio of the fractional N-divider is set to spur-free values regardless of the desired frequency of the output signal. In particular, the division ratio of the fractional N-divider is preferably set to values that are neither close to an integer nor close to a half-integer.

A particular advantage may be achieved if the frequency synthesizer is implemented on a single chip.

Since the above-proposed fractional-N frequency synthesizer has significantly reduced spur levels, it may be advantageously implemented in a single-chip configuration, in which typically measures for spur reduction are limited by design considerations and size limitations.

DETAILED DESCRIPTION OF THE INVENTION

Preferred embodiments of the present invention will be described in the following with reference to the accompanying figures, wherein in the figures, identical objects are indicated by identical reference numbers. It is understood that the present invention shall not be limited to the described embodiments, and that the described features and aspects of the embodiments may be modified or combined to form further embodiments of the present invention.

In the following description of the invention, reference is made to sign flips of different direction (plus to minus or minus to plus), and to transitions (switches) of signal levels having different direction (from a low level to a high level of a digital signal or from the high level to the low level), i.e. up-slopes or down-slopes. Therein, it is understood that the invention shall not be limited to the explicitly disclosed correlations between such sign flips and transitions of signal level, since it is well within the ability of the expert to modify the invention so that positive sign flips are replaced by negative sign flips and/or positive transitions of signal level are replaced by negative transitions of signal level, for instance by providing NOT-gates on the signal lines disclosed below, or by changing signs of integrator gains.

Figure 2:
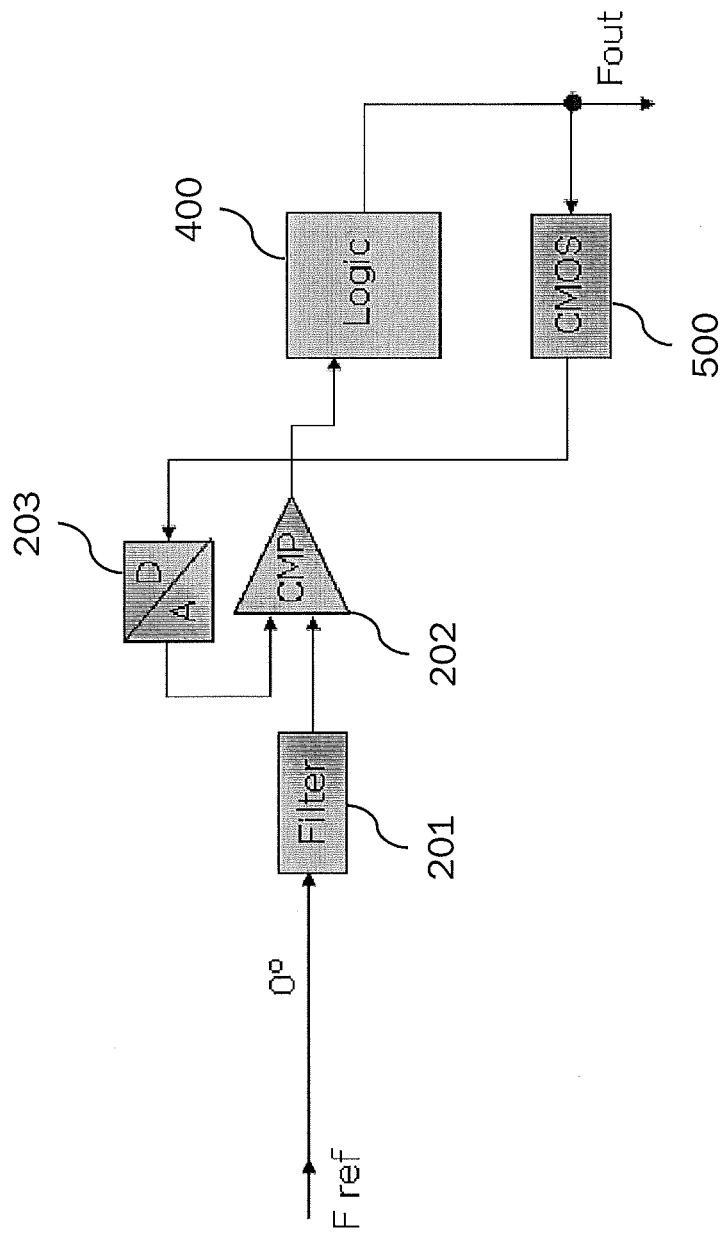
FIG. 2 illustrates a signal generator for generating a digital signal of tunable frequency according to a first embodiment of the invention.

FIG. 2 illustrates a signal generator for generating a signal having a tunable frequency according to a first embodiment of the invention. The signal generator comprises a filter 201 (first filter), a comparator 202 (first comparator), a digital-to-analog converter 203 (first digital-to-analog converter), a logic module 400 and a controller 500. A reference frequency Fref of a digital reference signal that is e.g. generated by an oscillating crystal is fed to the filter 201. The reference signal is a digital signal, such as a rectangular signal. For exemplary purposes, the reference frequency Fref is assumed to be 100

MHz. The filter 201 is an integrator, and may comprise a capacitor (first capacitor) connected to a current source (first current source) for charging the capacitor with a constant current. The comparator 202 preferably represents an analog level trigger.

As will be described with reference to FIGS. 3, 4A, and 4B, integration by the filter 201 is triggered by a transition (switch) of the reference signal Fref from the low level to the high level, and the filter 201 outputs an integration value (first integration value) as an analog signal (first analog signal). The analog signal is fed to the comparator 202. The controller 500, as will be described with reference to FIGS. 4A and 4B outputs a digital sequence indicating a control value (first control value), that indicates a threshold value, to the digital-to-analog converter 203.

The digital-to-analog converter 203 is e.g. an 8-bit digital-to-analog converter, so that the control value may be adjusted between a minimum value and a maximum value in $2^8-1=255$ steps. The digital-to-analog converter 203 converts the digital sequence output by the controller 500 to the control value, which is an analog value. The control value is fed to the comparator 202.

The comparator 202 compares the signal level of the analog signal to the control value and outputs a digital signal (first digital signal) in accordance with the result of the comparison. If the signal level of the analog signal (value of the analog signal) exceeds the control value, the comparator 202 outputs a high level, otherwise a low level of the digital signal. In other words, the comparator 202 continuously observes a difference (first difference) between the signal level of the analog signal and the control value, to continuously determine a sign thereof and to determine sign flips of the difference. Sign flips are detected when the signal level of the analog signal rises above the threshold indicated by the control value, or when the signal level of the analog signal drops below the threshold indicated by the control value. As indicated above, the comparator 202 is preferably represented by an analog level trigger that compares the signal level of the analog signal to the control value (or a threshold indicated by the first control value) to detect sign flips of the difference thereof. Further preferably, the control value itself represents the threshold, that is, the first control value is e.g. a voltage level that may be directly compared to the signal level of the analog signal.

A subset of transitions (switches) of the signal level of the digital signal output by the comparator 202 coincides with respective sign flips determined by the comparator 202. As one example, the up-slopes of the digital signal output by the comparator 202 (see timings t11, t12, t13, t14 in FIGS. 4A, 4B) respectively coincide with the sign flips determined by the comparator 202 occurring if the signal level of the analog signal is initially smaller than the threshold indicated by the control value and rises above the threshold indicated by the control value.

The digital signal output by the comparator 202 is fed to the logic module 400. In the logic module 400, the digital signal output by the comparator 202 is processed to form a digital output signal of frequency Fout. The digital output signal (digital signal of tunable frequency) is generated so that the subset of transitions of signal level coincides with respective sign flips determined by the comparator 202, so that for instance the up-slopes of the digital output signal output by the logic module 400 respectively coincide with the up-slopes of the digital signal output by the comparator 202.

In one embodiment, the remaining transitions of signal level that are not in the above subset of transitions of signal level are triggered a predetermined period of time T3 after the preceding opposite transition of signal level. In other words, following after each transition in a first direction (i.e. from the low level to the high level or from the high level to the low level), after a predetermined period of time, the logic module 400 is triggered to provide for a transition of signal level in the opposite direction. The predetermined period of time T3 is chosen smaller than the period corresponding to the highest frequency that may be output by the signal generator. The duration of the predetermined period of time T3 is limited by considerations according to which neither the high level pulses nor the intervals between high level pulses of the digital output signal may become too short, because otherwise downstream digital circuitry for processing the digital output signal that has non-zero capacitance would not be able to process the digital output signal accurately. In one example, the predetermined period of time T3 is chosen to correspond to half the period of the highest possible frequency output of the signal generator. In another example, the predetermined period of time T3 is chosen to correspond to half the period of the reference signal Fref. Said triggers may be provided by a mono-flop comprised e.g. by the logic module 400.

The integration process performed by the filter 201 is reset after a predetermined period of time T4. For instance, the integration process may be reset after a predetermined period of time T4 corresponding to half the period of the highest possible frequency output of the signal generator. Further, the integration process may be reset after a predetermined period of time T4 corresponding to half the period of the reference signal. Alternatively, the integration process performed by the filter 201 may be reset after a predetermined period of time T4 corresponding to the period of the reference signal. Alternatively, the predetermined period of time T4 may be chosen between half the period of the reference signal and the period of the reference signal.

In another embodiment of the invention, the logic module 400 is omitted, and the digital output signal corresponds to the digital signal output by the comparator 202. In this case, the remaining transitions of signal level that are not in the above subset of transitions of signal level are triggered by the resetting of the integration process by the filter 201, at which point in time the signal level of the analog signal output by the filter 201 drops below the threshold indicated by the control value. Omitting the logic module 400 is especially advantageously if the voltage of the high level of the digital signal output by the comparator 202 coincides with the voltage of the high level required by downstream digital circuitry for processing the digital output signal, e.g. if the comparator 202 and the downstream digital circuitry are CMOS elements.

The digital output signal output by the logic module 400 or the comparator 202 is fed to the controller 500, which controls the digital-to-analog-converter 203 to output the control value. As will be described with reference to FIGS. 3, 4A, and 4B, the control value is adjusted for each period of the analog signal, or respectively for each period of the reference signal.

Figure 3:
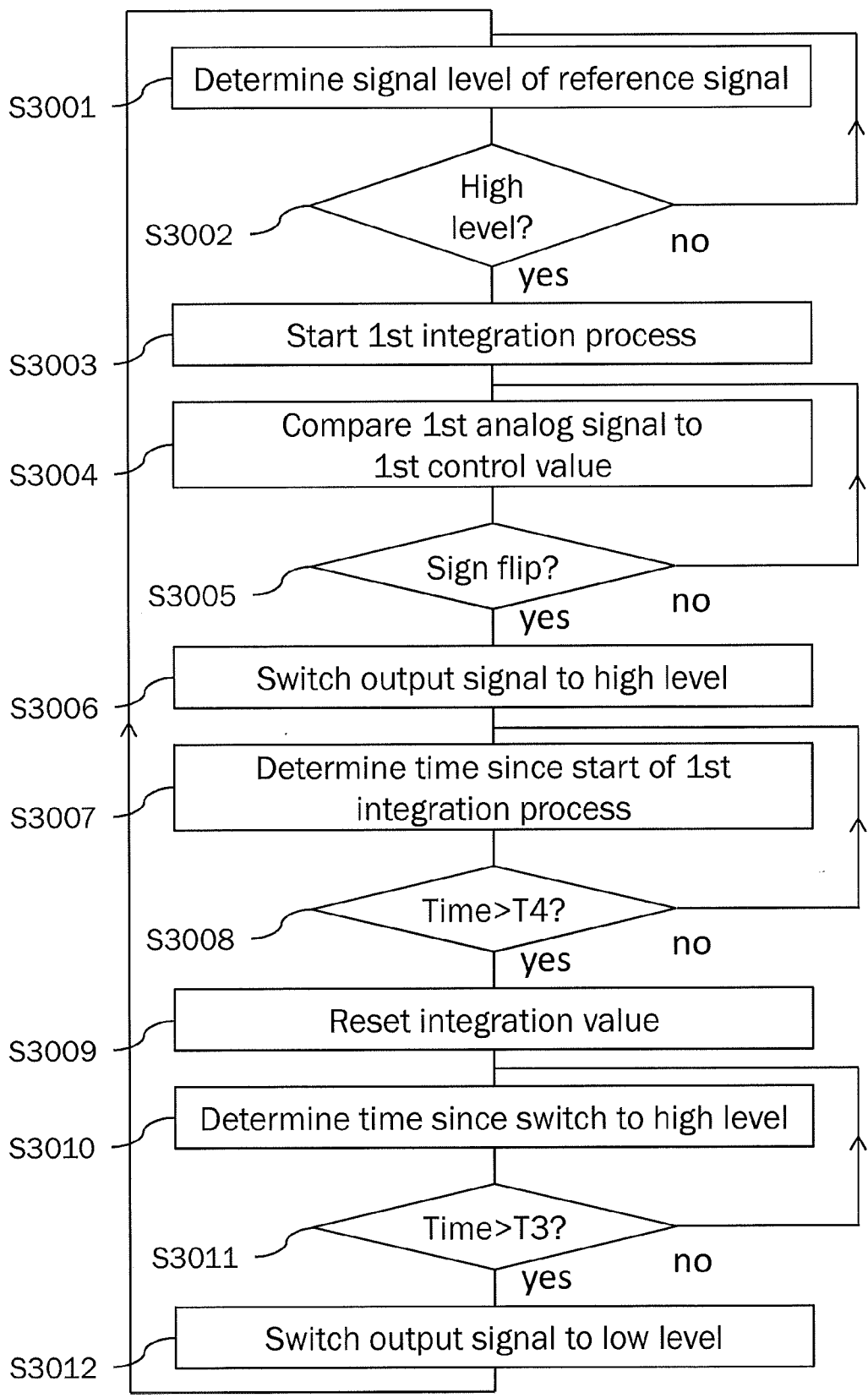
FIG. 3 is a flowchart illustrating the operation of the signal generator according to the first embodiment of the invention.

FIG. 3 is a flowchart illustrating the operation of the signal generator described above. Steps S3001 to S3003 relate to the filter 201 in FIG. 2. At step S3001, the signal level of the reference signal is determined. If at step S3002 the signal level is found to have transitioned to the high level, an integration process (first integration process) is started at step S3003. If the signal level of the reference signal is not the high level, the process returns to step S3001. In other words, the integration process by the filter 201 is triggered by the up-slopes of the reference signal. Alternatively, the filter 201 may trigger on the down-slopes of the reference signal.

Steps S3004 to S3006 relate to the comparator 202 in FIG. 2. At step S3004, the signal level of the first analog signal which corresponds to the integration value of the first integration process, is compared to the first control value. That is, sign flips of the difference between the signal level of the first analog signal and the first control value are determined. If a sign flip of the first difference is determined at step S3005, the signal level of the first digital signal, or respectively the signal level of the digital output signal, is switched to the high level. Otherwise, the process returns to step S3004. In other words, the up-slopes of the first digital signal, or respectively the up-slopes of the digital output signal, are triggered by the first analog signal rising above the threshold indicated by the first control value. Alternatively, the down-slopes of the respective signals may be triggered by the sign flips determined in step S3005.

Steps S3007 to S3009 further relate to the filter 201 in FIG. 2. At step S3007, an elapsed time since the start of the first integration process is determined. If at step S3008 the elapsed time is found to exceed the predetermined period of time T4, the integration value (first integration value) of the first integration process is reset (see timings t02, t04, t06 and t08 in FIGS. 4A, 4B). Otherwise, the process returns to step S3007.

Steps S3010 to S3012 relate to the logic module 400 in FIG. 2. At step S3010, an elapsed time since the transition of the first digital signal, or respectively the digital output signal, to the high level is determined. If at step S3011, it is found that the elapsed time exceeds the predetermined period of time T3, the signal level of the digital output signal is switched back to the low level (see timings t21, t22, t23 and t24 in FIG. 4A, 4B). Otherwise, the process returns to step S3010. In other words, triggers for the down-slopes of the digital output signal are provided a predetermined period of time after the respective preceding up-slope. If in an alternative embodiment the down-slopes are triggered by the sign flips determined in step S3005, triggers for the up-slopes of the digital output signal are provided a predetermined period of time after the respective preceding down-slope.

The process flow shown in FIG. 3 is understood to be a continuous process that is performed for each period of the reference signal. This is illustrated by the flow line connecting steps S3012 and S3001.

In the above process flow, it is understood that steps S3007 to S3009 may be exchanged with steps S3010 to S3012.

Figure 4A:
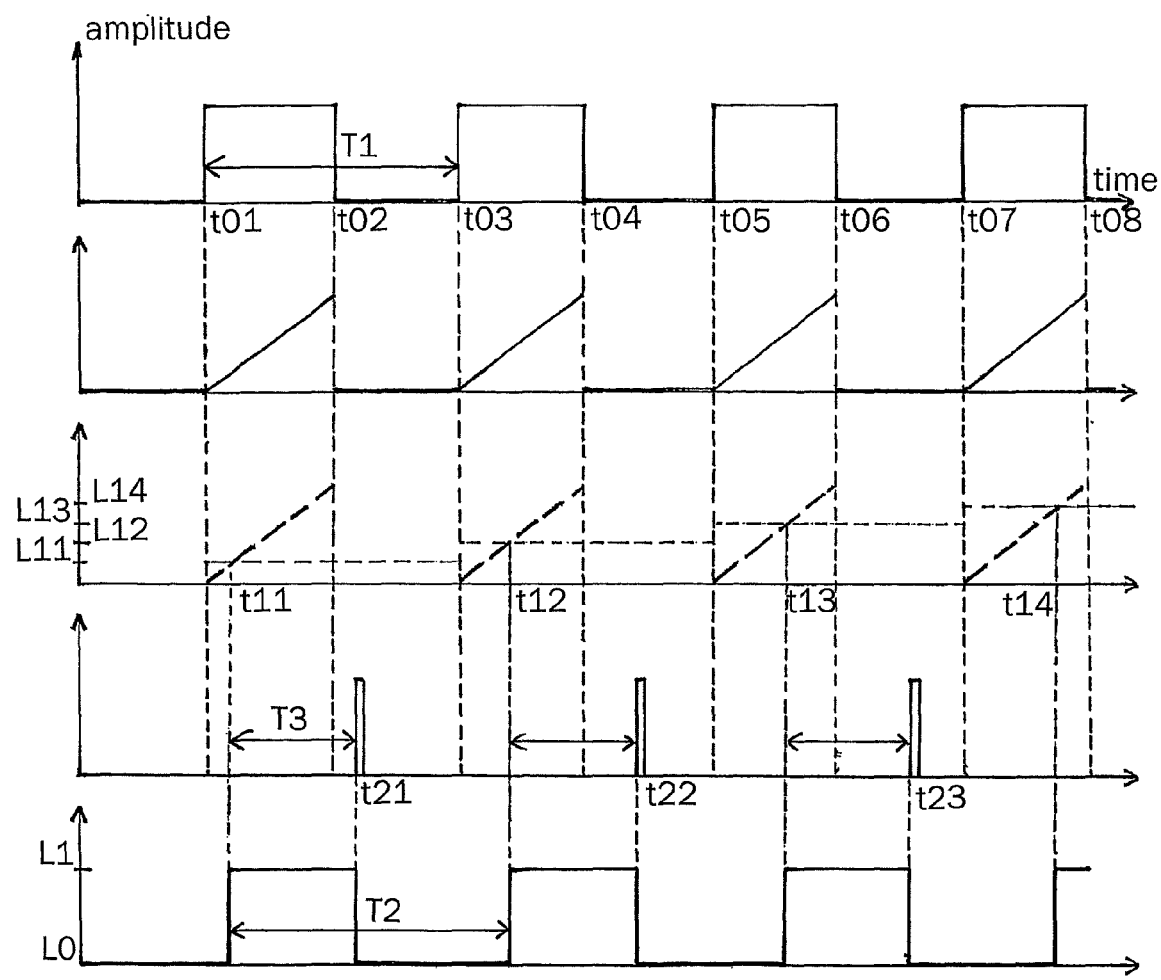
FIG. 4A is a timing diagram illustrating the operation of the signal generator according to the first embodiment of the invention.

FIG. 4A is a timing diagram illustrating the operation of the signal generator of FIG. 2 in a case in which the frequency Fout of the digital output signal of the signal generator is lower than the frequency Fref of the reference signal. In each of the individual diagrams, the horizontal axis denotes time, and the vertical axis denotes amplitude (i.e. signal level). The same holds true for FIGS. 4B, 7A and 7B. In FIG. 4A, the first diagram from the top indicates the reference signal, the second diagram indicates the first analog signal, the third diagram indicates the operation of the comparator 202 in FIG. 2, the fourth diagram schematically indicates the down-trigger provided by the logic module 400 in FIG. 2, and the fifth diagram indicates the digital output signal of the signal generator of FIG. 2.

The reference signal illustrated in FIG. 4A has up-slopes of signal level at timings t01, t03, t05 and t07, and has down-slopes of signal level at timings t02, t04, t06 and t08. Triggered by the up-slopes of the reference signal, the filter 201 in FIG. 2 starts the first integration process, so that the signal level of the first analog signal starts to rise continuously and monotonously at respective timings t01, t03, t05 and t07. As can be seen in the second diagram of FIG. 4A, the integration value is reset triggered by the down-slopes of the reference signal. However, in an alternative embodiment the resetting of the integration value could also be triggered by the next up-slope of the reference signal. In a further alternative embodiment, a trigger for resetting the integration value is provided at arbitrary timings between the respective down-slopes and the respective subsequent up-slopes of the reference signal.

The first control value is adjusted for each period of the reference signal, or respectively for each period of the first analog signal, as is illustrated in the third diagram of FIG. 4A. In the present case, the first control value is adjusted synchronously with the up-slopes of the reference signal. Here, the first control value, from period to period of the reference signal is gradually increased by constant amounts, from a level L11 to a level L12 at timing t03, from the level L12 to a level L13 at timing t05, and from the level L13 to a level L14 at timing t07. The continuously and monotonously rising signal level of the first analog signal crosses the threshold indicated by the first control value from below at timing t11 in the first period of the reference signal illustrated in FIG. 4A, at timing t12 in the second period of the reference signal, at timing t13 in the third period of the reference signal, and at timing t14 in the fourth period of the reference signal.

As can be seen from the third diagram of FIG. 4A, the timing at which the signal level of the first analog signal crosses the threshold indicated by the first control value in each period of the reference signal occurs later than in the previous period of the reference signal. That is, in FIG. 4A the relation t11−t01<t12−t03<t13−t05<t14−t07 holds.

As can be seen in the fifth diagram of FIG. 4A, the output of the high level L1 of the digital output signal is triggered by the first analog signal rising above the threshold indicated by the first control value at respective timings t11, t12, t13 and t14. In other words, a subset of switches of the signal level of the digital output signal are coincident with a respective sign flip of the determined sign of the first difference between the value of the first analog signal and the threshold indicated by the first control value. More specifically, every other of the switches of the signal level of the digital output signal (in the present case all up-slopes of the digital output signal) is coincident with a respective sign flip of the determined sign of the first difference.

As illustrated in the fourth diagram of FIG. 4A, a trigger for the down-slope of the digital output signal to the low level L0 is provided at a constant predetermined period of time T3 after the up-trigger. The pulses at timings t21, t22 and t23 in the fourth diagram are understood as schematic examples and may of course have different form, duration, etc., as long as they serve as down-triggers of the digital output signal in the fifth diagram.

The period of the reference signal is denoted by T1, and the period of the digital output signal is denoted by T2. As can be clearly seen from a comparison on the first diagram and the fifth diagram in FIG. 4A, the period T2 of the digital output signal is longer than the period T1 of the reference signal. Accordingly, the frequency Fout of the digital output signal is lower than the frequency Fref of the reference signal. Since the down-trigger is provided for at a predetermined period of time T3 after the respective preceding up-trigger, the duty ratio of the digital output signal is different from 50%. In the example of FIG. 4A, in which the predetermined period of time T3 is chosen to be half the period T1, the duty ratio of the digital output signal is smaller than 50%.

Figure 4B:
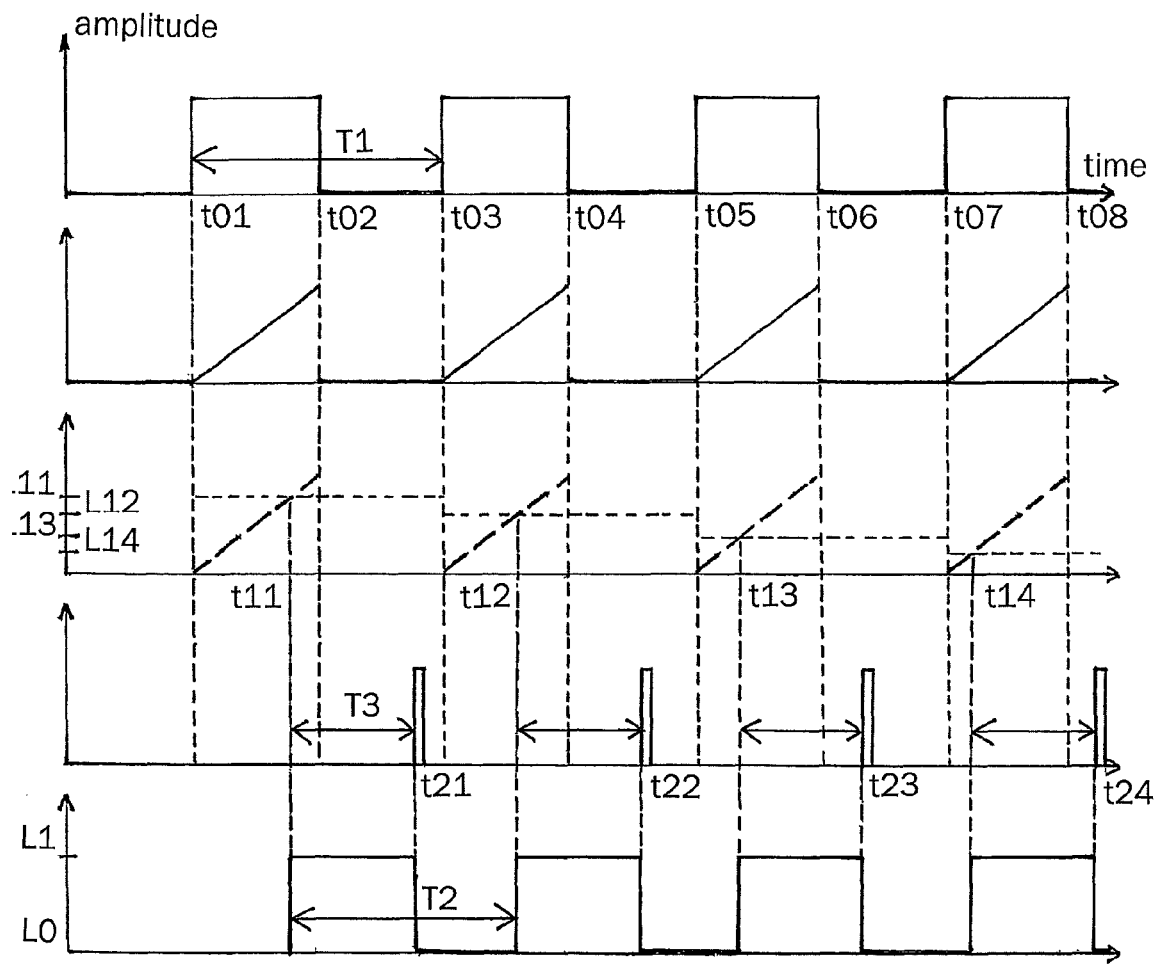
FIG. 4B is a further timing diagram illustrating the operation of the signal generator according to the first embodiment of the invention.

FIG. 4B is a timing diagram illustrating the operation of the signal generator of FIG. 2, in a case in which the frequency Fout of the digital output signal of the signal generator is higher than the frequency Fref of the reference signal. The process for generating a digital output signal illustrated by the timing diagram of FIG. 4B is different from the respective one illustrated by FIG. 4A only in that the first control value is gradually decreased instead of gradually increased. Otherwise, the processes are identical.

As in FIG. 4A, the first diagram from the top indicates the reference signal, the second diagram indicates the first analog signal, the third diagram indicates the operation of the comparator 202 in FIG. 2, the fourth diagram schematically indicates the down-trigger provided by the logic module 400 in FIG. 2, and the fifth diagram indicates the digital output signal of the signal generator of FIG. 2. The first two diagrams are identical to the first two diagrams in FIG. 4A. In the third diagram, the first control value is changed from a level L11 to a level L12 at timing t03, from the level L12 to a level L13 at timing t05, and from the level L13 to a level L14 at timing t07.

As in the case of FIG. 4A, the first control value is adjusted for each period of the reference signal, or respectively for each period of the first analog signal. Specifically, in the present case the first control value is adjusted synchronously with the up-slopes of the reference signal. By contrast to FIG. 4A, here the first control value is gradually decreased by constant amounts from period to period of the reference signal. The first control value is reduced from the level L11 to the level L12 at timing t03, from the level L12 to the level L13 at timing t05, and from the level L13 to the level L14 at timing t07. The continuously and monotonously rising signal level of the first analog signal crosses the threshold indicated by the first control value from below at timing t11 in the first period of the reference signal illustrated in FIG. 4B, at timing t12 in the second period of the reference signal, at timing t13 in the third period of the reference signal, and at timing t14 in the fourth period of the reference signal.

As can be seen from the third diagram of FIG. 4B, the timing at which the signal level of the first analog signal crosses the threshold indicated by the first control value in each period of the reference signal occurs earlier than in the previous period of the reference signal. That is, in FIG. 4B the relation t11−t01>t12−t03>t13−t05>t14−t07 holds.

Referring to the fifth diagram of FIG. 4B, the up-slopes of the digital output signal are triggered by the first analog signal rising above the threshold indicated by the first control value at respective timings t11, t12, t13, and t14, similar to the case illustrated in FIG. 4A. In other words, a subset of switches of the signal level of the digital output signal are coincident with a respective sign flip of the determined sign of the first difference between the value of the first analog signal and the threshold indicated by the first control value. More specifically, every other of the switches of the signal level of the digital output signal (in the present case all up-slopes of the digital output signal) is coincident with a respective sign flip of the determined sign of the first difference.

Referring to the fourth diagram of FIG. 4B, a trigger for the down-slope of the digital output signal is provided at a constant predetermined period of time T3 after the up-trigger, as in the case illustrated in FIG. 4A. The pulses at timings t21, t22 and t23 in the fourth diagram are understood as schematic examples and may of course have different form, duration, etc., as long as they serve as down-triggers of the digital output signal in the fifth diagram.

As can be seen from a comparison of the first diagram and the fifth diagram of FIG. 4B, the period T2 of the digital output signal is shorter than the period T1 of the reference signal. Accordingly, the frequency Fout of the digital output signal is higher than the frequency Fref of the reference signal. Since the down-trigger is provided for at a predetermined period of time T3 after the respective preceding up-trigger, the duty ratio of the digital output signal is different from 50%. In the example of FIG. 4B, in which the predetermined period of time T3 is chosen to be half the period T1, the duty ratio of the digital output signal is larger than 50%.

In FIGS. 4A and 4B a case may arise in which the first control value reaches a maximum value C1max (e.g. indicated by a maximum value that is attained by the first analog value) so that increasing the first control value any further would not be expedient (i.e. an overflow occurs). Likewise, a case may arise in which the first control value reaches a value C1 min (e.g. zero) so that decreasing the first control value any further would not be expedient (i.e. an underflow occurs). In the former case, if after increasing the first control value C1 by the constant amount ΔC the first control value exceeds the maximum value C1max, the maximum value C1max may be subtracted from the first control value, so that $$C1 \rightarrow (C1+\Delta C)_{mod \cdot C1max} \quad (1)$$

Subsequently, the first control value may be further increased, until the maximum value C1max is reached again. Then, the above procedure is repeated.

Likewise, in the latter case, if after decreasing the first control value C1 by the constant amount ΔC the first control value drops below the minimum value C1 min, the maximum value C1max may be added to the first control value, so that again a first control value according to equation (1) is obtained (wherein ΔC in (1) now is negative). Subsequently, the first control value may be further decreased, until the minimum value C1 min is reached again. Then, the above procedure is repeated.

In both cases, if the first integration process is reset before the subsequent up-slope of the reference signal, it may be necessary to skip a pulse of the digital output signal.

As has been described with reference to FIGS. 4A and 4B, the frequency Fout of the digital output signal may be tuned by adjusting the first control value for each period of the reference signal. Specifically, if ΔC is the constant amount by which the first control value C1 is changed for each period of the reference signal, a is the change rate of the first analog signal, and ΔT is the shift in period of the digital output signal compared to the reference signal, and assuming that the first control value itself is a voltage level serving as the threshold, the following schematic relation holds:

$$\Delta T = \Delta C / a. \quad (2)$$

In equation (2), ΔC may be positive or negative. Thus, by appropriately choosing the constant amount of change ΔC with respect to the change rate a, the frequency of the digital output signal may be tuned to $$F\text{out} = 1/(1/F\text{ref} + \Delta T). \quad (3)$$

On the other hand, if the first control value is kept constant and is not adjusted for each period of the reference signal, the output frequency Fout of the digital output signal is identical to the frequency Fref of the reference signal.

Figure 5:
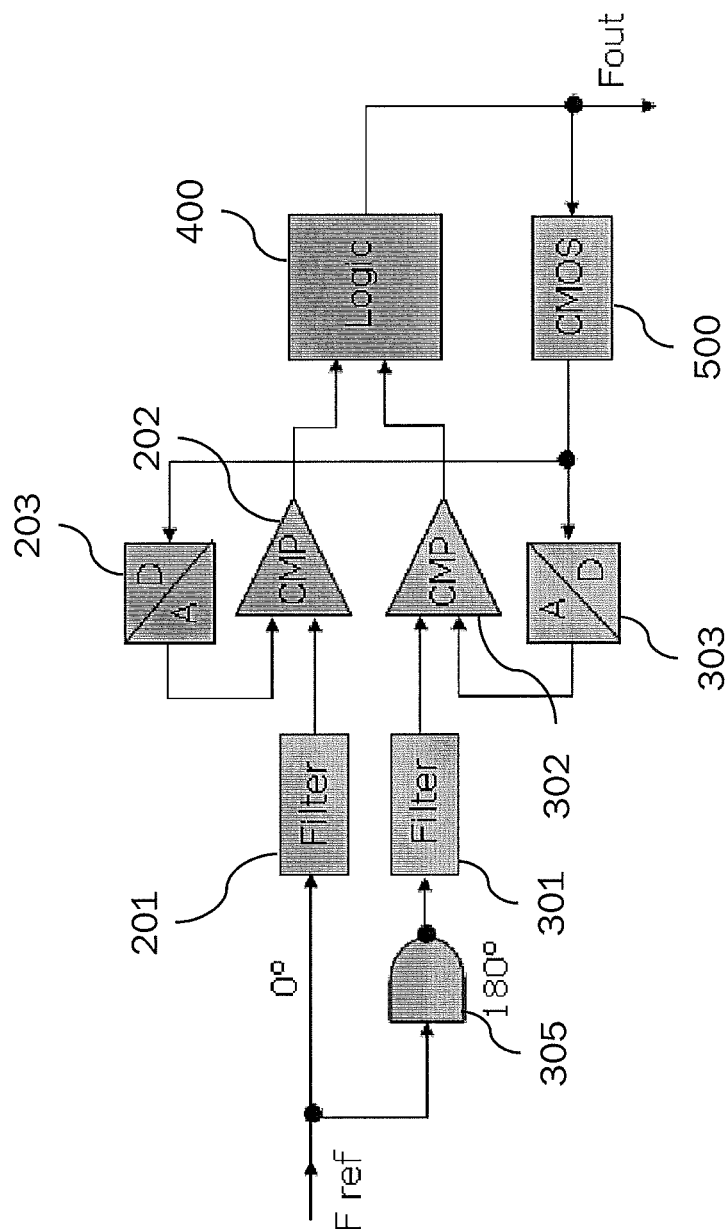
FIG. 5 illustrates a signal generator for generating a digital signal of tunable frequency according to a second embodiment of the present invention.

FIG. 5 illustrates a signal generator for generating a digital signal of tunable frequency according to a second embodiment of the invention. In addition to a first reference branch formed by the first filter 201, the first comparator 202 and the first digital-to-analog converter 203, the signal generator of FIG. 5 also comprises a second reference branch. Like-numbered elements in FIGS. 2 and 5 are understood to be identical in configuration as well as in function, unless indicated otherwise. The first filter 201, the first comparator 202, and the first digital-to-analog converter 203 are identical to the like-numbered elements in FIG. 2. The second reference branch is formed by a NOT-gate 305 which serves as a phase shifter, a second filter 301, a second comparator 302, and a second digital-to-analog converter 303.

The reference signal Fref is fed to the phase shifter 305, in which the high levels of the reference signal are transformed into low levels and vise versa. If the reference signal Fref has a duty ratio of 50%, this corresponds to a phase shift by 180 degrees. The phase-shifted reference signal is fed to the second filter 301. The function of the second filter 301 is identical to the function of the first filter 201. Integration by the second filter 301 is triggered by a switch of the phase-shifted reference signal from the low level to the high level, and the second filter 301 outputs a second integration value as a second analog signal. Since the phase-shifted reference signal is shifted by 180 degrees with respect to the reference signal, the second analog signal is phase-shifted with respect to the first analog signal by 180 degrees.

The controller 500, as described in connection with FIG. 2, outputs a digital sequence indicating the first control value to the first digital-to-analog converter 203. Further, the controller 500 outputs a digital sequence indicating a second control value that indicates a threshold value, to the second digital-to-analog converter 303. The configuration and function of the second digital-to-analog converter 303 is identical to the configuration and function of the first digital-to-analog converter 203 in FIG. 2. The second digital-to-analog converter 303 converts the digital sequence output by the controller 500 to the second control value, which is an analog value, and feeds the second control value to the second comparator 302.

The configuration and function of the second comparator 302 is identical to the configuration and function of the first comparator 202 in FIG. 2. However, it has to be noted that the second control value may be different from the first control value. The second comparator 302 compares the signal level of the second analog signal to the second control value and outputs a second digital signal in accordance with the result of the comparison. If the signal level of the second analog signal exceeds the second control value, the second comparator 302 outputs a high level, otherwise a low level of the second digital signal. In other words, the second comparator 302 continuously observes a difference (second difference) between the signal level of the second analog signal and the second control value to continuously determine a sign of the second difference and to determine sign flips of the second difference. As indicated with respect to the comparator 202, also the second comparator 302 is preferably represented by an analog level trigger that compares the signal level of the second analog signal to the second control value (or a threshold indicated by the second control value) to detect sign flips of the difference thereof.

The first digital signal output by the first comparator 202 and the second digital signal output by the second comparator 302 are fed to the logic module 400. In the logic module 400, the first digital signal and the second digital signal are processed to form a digital output signal of frequency Fout. In this embodiment, the logic module 400 is configured as a logical XOR-gate. That is, the signal level of the digital output signal is the low level, if the signal levels of both the first digital signal and the second digital signal are the low level. If the first digital signal switches to the high level, also the digital output signal is switched to the high level. Then, if also the second digital signal switches to the high level, the digital output signal is switched back to the low level. In other words, triggers for the up-slopes of the digital output signal are provided by the first digital signal, and triggers for the down-slopes of the digital output signal are provided by the second digital signal. In the above, it is understood that the roles of the first digital signal and the second digital signal may be exchanged.

In this embodiment, both the timings of the up-slopes of the digital output signal and the timings of the down-slopes of the digital output signal may be adjusted by adjusting the first control value and the second control value, as will be discussed with reference to FIGS. 7A and 7B. If both control values are adjusted for each period of the reference signal, or respectively for each period of the first analog signal, both the frequency of the digital output signal and the duty-ratio of the digital output signal may be tuned. The adjusting of the first control value and the second control value is performed by the controller 500, which adjusts the control values in accordance with a desired frequency and/or duty ratio of the digital output signal.

Figure 6A:
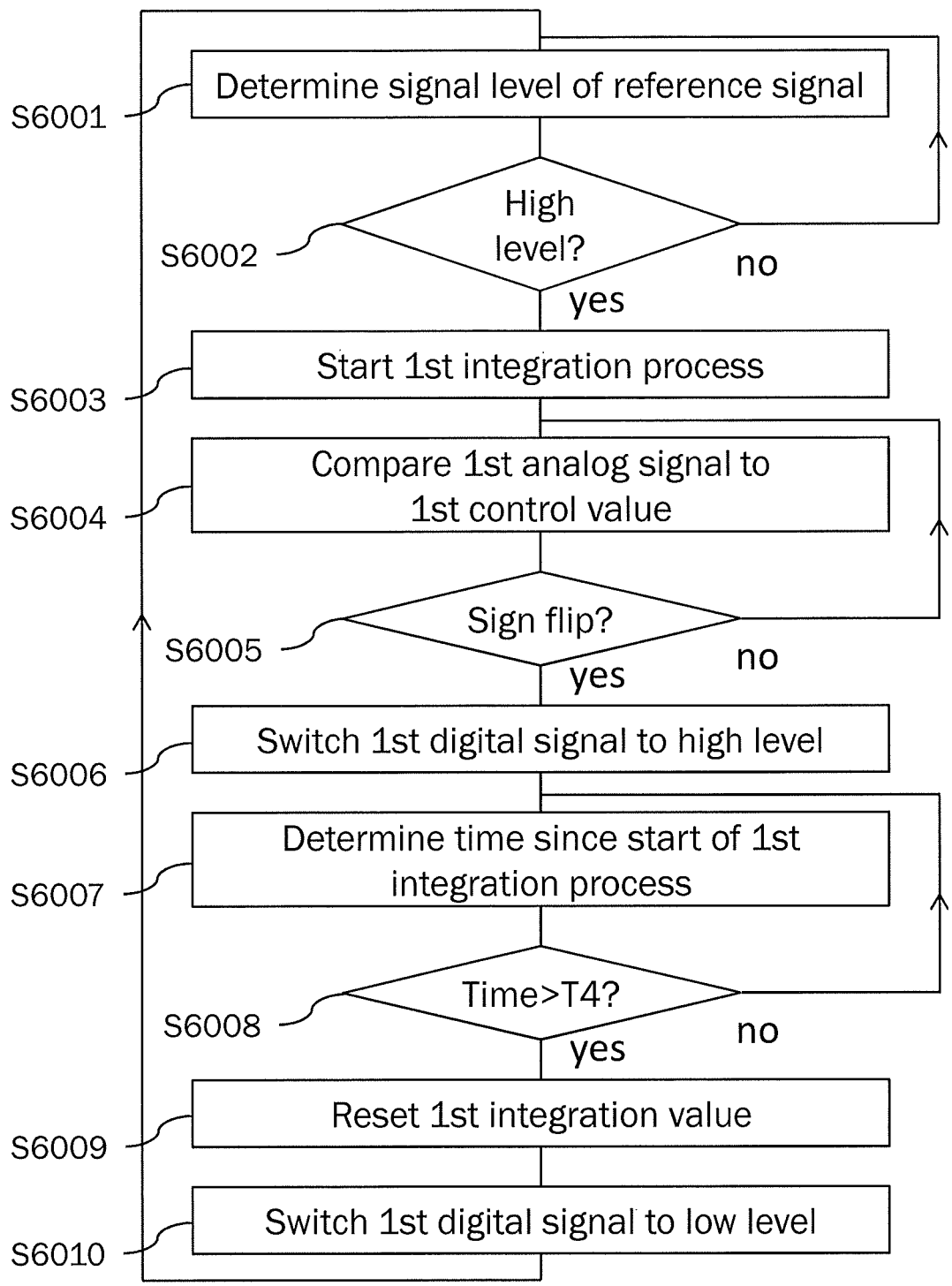
FIGS. 6A to 6C are flowcharts illustrating the operation of the signal generator according to the second embodiment of the invention.
Figure 6B:
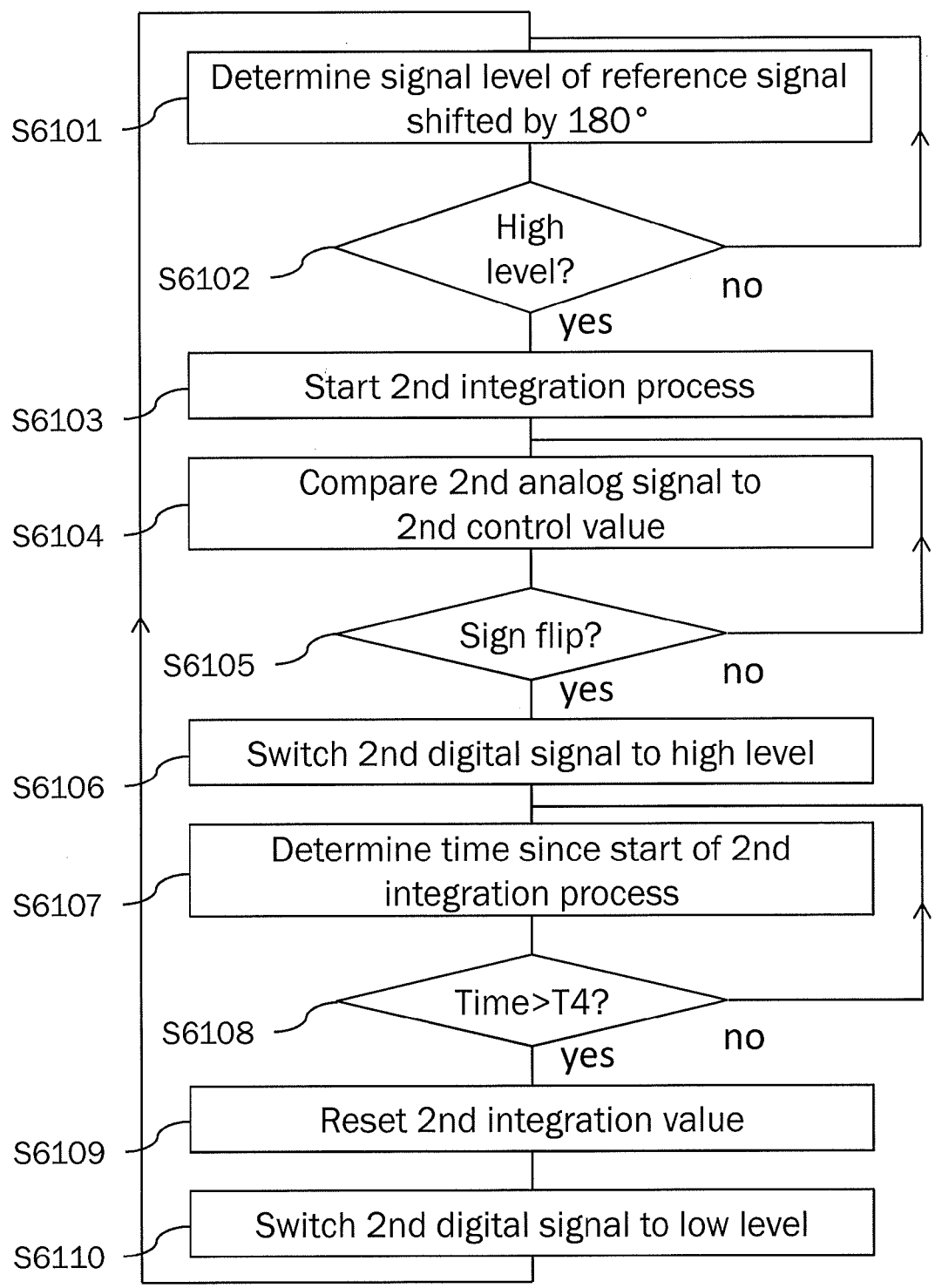
Figure 6C:
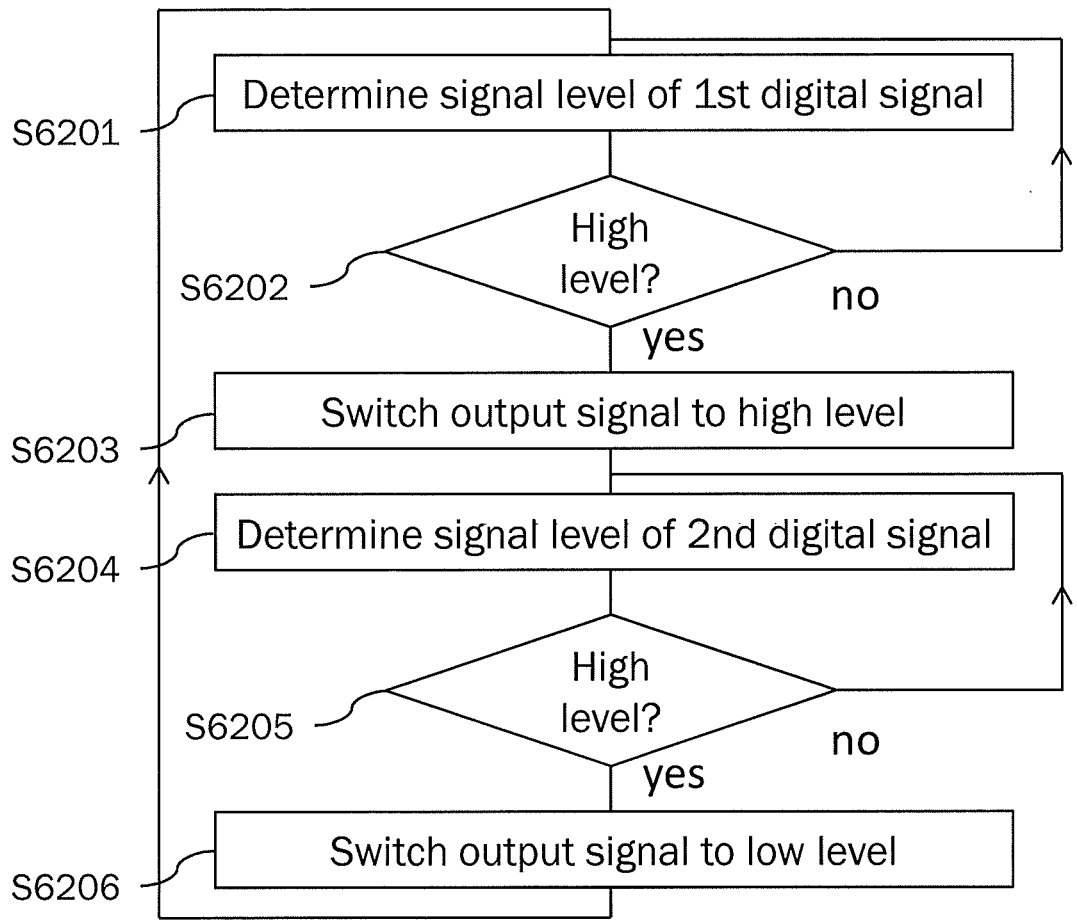

FIGS. 6A to 6C are flowcharts illustrating the operation of the signal generator according to the second embodiment of the invention. Therein, FIG. 6A illustrates the operation of the first reference branch, FIG. 6B illustrates the operation of the second reference branch, and FIG. 6C illustrates the operation of the logic module 400. Steps S6001 to S6009 and S6101 to S6109, unless indicated otherwise, correspond to steps S3001 to S3009, so that respective details discussed with reference to FIG. 3 also apply to FIGS. 6A and 6B.

In FIG. 6A, steps S6001 to S6003 relate to the first filter 201 in FIG. 5. At step S6001, the signal level of the reference signal is determined. If at step S6002, the signal level is found to have transitioned to the high level the, first integration process is started at step S6003. If the signal level of the reference signal is not the high level, the process returns to step S6001. In other words, the first integration process is triggered by the up-slopes of the reference signal. Alternatively, the filter 201 may trigger on the down-slopes of the reference signal.

Steps S6004 to S6006 relate to the first comparator 202 in FIG. 5. At step S6004, the signal level of the first analog signal that corresponds to the first integration value of the first integration process is compared to the first control value. That is, sign flips of the first difference between the signal level of the first analog signal and the threshold indicated by the first control value are determined. If a sign flip of the first difference is determined at step S6005, the signal level of the first digital signal is switched to the high level. Otherwise, the process returns to step S6004. In other words, the up-slopes of the first digital signal are triggered by the first analog signal rising above the threshold indicated by the first control value. Alternatively, the down-slopes of the first digital signal may be triggered by the sign flips determined in step S6005.

Steps S6007 to S6009 further relate to the first filter 201 in FIG. 5. At step S6007, an elapsed time since the start of the first integration process is determined. If at step S6008 the elapsed time is found to exceed the predetermined period of time T4, the first integration value of the first integration process is reset (see timings t02, t04, t06, and t08 in FIGS. 7A, 7B). Otherwise, the process returns to step S6007.

At step S6010, the first digital signal is switched to the low level. Since in this embodiment the up-slopes of the first digital signal are used as triggers for the digital output signal, the concrete timing of this switch is irrelevant, as long as the period during which the signal level of the first digital signal is the high level is sufficiently long so that the first digital signal may be properly processed by digital circuitry. If the first integration value is reset, the first digital signal switches to the low level automatically, since the first integration value drops below the first control value. Alternatively, step S6010 may also be performed before step S6007.

In FIG. 6B, steps S6101 to S6103 relate to the second filter 301 in FIG. 5. At step S6101, the signal level of the phase-shifted reference signal is determined. If at step S6102 the signal level is found to have transitioned to the high level, the second integration process is started at step S6103. If the signal level of the phase-shifted reference signal is not the high level, the process returns to step S6101. In other words, the second integration process is triggered by the up-slopes of the phase-shifted reference signal (or correspondingly, by the down-slopes of the reference signal). Alternatively, the second filter 301 may trigger on the down-slopes of the phase-shifted reference signal (or correspondingly, on the up-slopes of the reference signal).

Steps S6104 to S6106 relate to the second comparator 302 in FIG. 5. At step S6104, the signal level of the second analog signal that corresponds to the second integration value of the second integration process is compared to the second control value. That is, sign flips of the second difference between the signal level of the second analog signal and the threshold indicated by the second control value are determined. If a sign flip of the second difference is determined at step S6105, the signal level of the second digital signal is switched to the high level. Otherwise, the process returns to step S6104. In other words, the up-slopes of the second digital signal are triggered by the second analog signal rising above the threshold indicated by the second control value. Alternatively, the down-slopes of the second digital signal may be triggered by the sign flips determined in step S6105.

Steps S6107 to S6109 further relate to the second filter 301 in FIG. 5. At step S6107, an elapsed time since the start of the second integration process is determined. If at step S6108 the elapsed time is found to exceed the predetermined period of time T4, the second integration value of the second integration process is reset (see timings t03, t05, and t07 in FIGS. 7A, 7B). Otherwise, the process returns to step S6107.

At step S6110, the second digital signal is switched to the low level. Since in this embodiment the up-slopes of the second digital signal are used as triggers for the digital output signal, the concrete timing of this switch is irrelevant, as long as the period during which the signal level of the second digital signal is the high level is sufficiently long so that the second digital signal may be properly processed by digital circuitry. If the second integration value is reset, the second digital signal switches to the low level automatically, since the second integration value drops below the second control value. Alternatively, step S6110 may also be performed before step S6107.

FIG. 6C illustrates the process by which the digital output signal is generated in the logic module 400 on the basis of the first digital signal and the second digital signal. At step S6201, the signal level of the first digital signal is determined. If at step S6202, the signal level of the first digital signal is found to have transitioned to the high level, the signal level of the digital output signal is switched to the high level at step S6203. Otherwise, the process flow returns to step S6201.

At step S6204, the signal level of the second digital signal is determined. If at step S6205, the signal level of the second digital signal is found to have transitioned to the high level, the signal level of the digital output signal is switched back to the low level at step S6206. Otherwise, the process flow returns to step S6204.

The process flow discussed above with reference to steps S6201 to S6206 describes the generation of a single pulse of the digital output signal. Accordingly, the process is to be understood as a continuous process for generating a plurality of consecutive pulses, as is indicated by the process flow line connecting steps S6206 and S6201.

The process flow described above with reference to steps S6201 to S6206 may be implemented by a logical XOR-gate. The up-slopes of the digital output signal are triggered by the first digital signal, more specifically by the up-slopes of the first digital signal. The down-slopes of the digital output signal are triggered by the second digital signal, more specifically by the up-slopes of the second digital signal. In alternative embodiments, the role of the first and second digital signals may be exchanged, and/or logical NOT-gates may be provided on either or both signal lines feeding the logic module 400, so that the down-slopes of the first and/or second digital signal serve as triggers for the logic module 400.

Figure 7A:
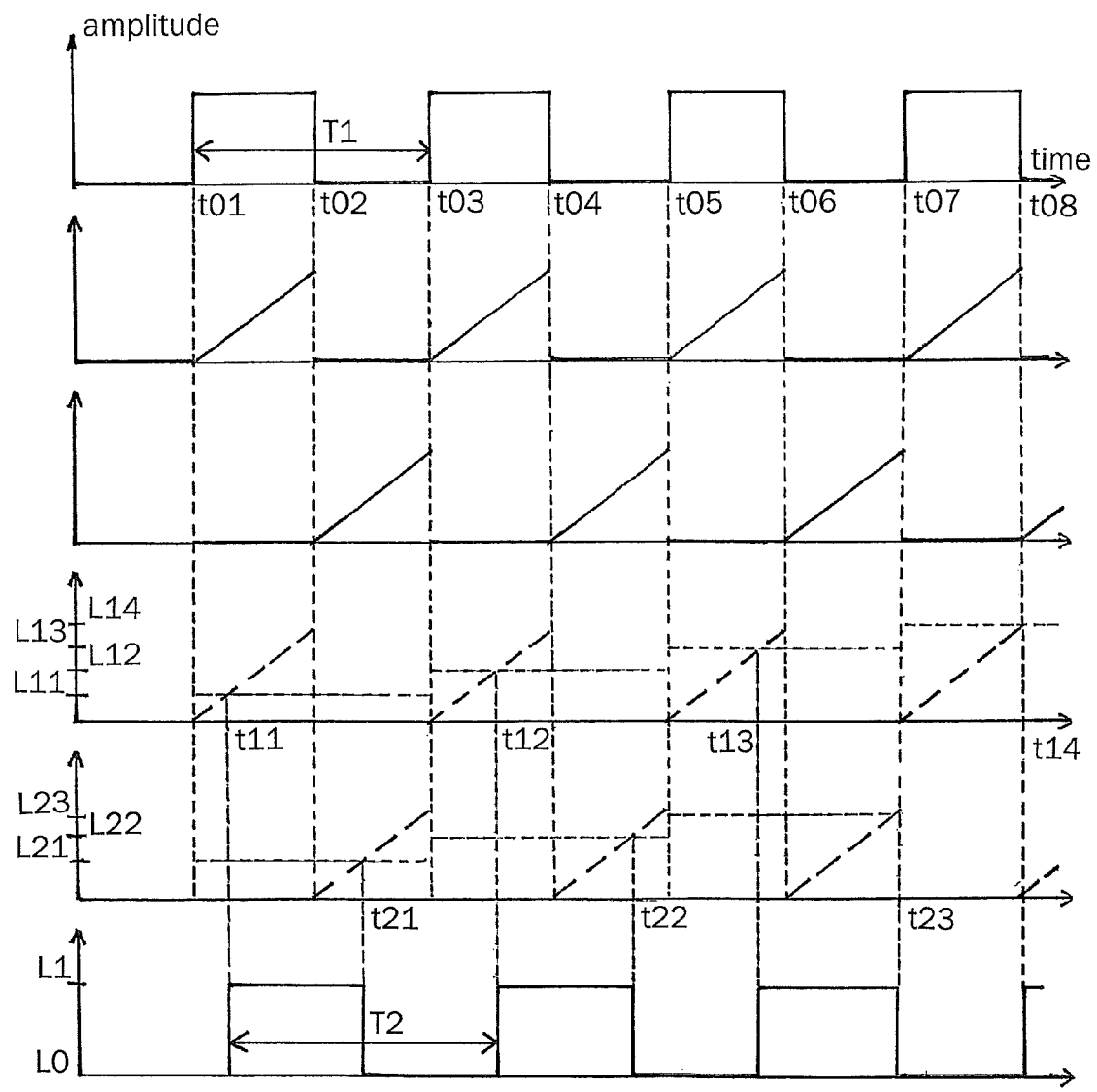
FIG. 7A is a timing diagram illustrating the operation of the signal generator according to the second embodiment of the present invention.

FIG. 7A is a timing diagram illustrating the operation of the signal generator of FIG. 5 having the first reference branch and the second reference branch, in a case in which the frequency Fout of the digital output signal of the signal generator is lower than the frequency Fref of the reference signal. The first diagram from the top indicates the reference signal, the second diagram indicates the first analog signal, the third diagram indicates the second analog signal, the fourth diagram indicates the operation of the first comparator 202 in FIG. 5, the fifth diagram indicates the operation of the second comparator 302 in FIG. 5, and the sixth diagram indicates the digital output signal of the signal generator of FIG. 5.

The reference signal illustrated in FIG. 7A has up-slopes of the signal level at timings t01, t03, t05, and t07, and has down-slopes of the signal level at timings t02, t04, t06, and t08. Triggered by the up-slopes of the reference signal, the first filter 201 in FIG. 5 starts the first integration process, so that the signal level of the first analog signal starts to rise continuously and monotonously at respective timings t01, t03, t05, and t07. Triggered by the up-slopes of the phase-shifted reference signal, the second filter 301 in FIG. 5 starts the second integration process. In the present case, the reference signal has a duty-ratio of 50% and the phase-shifted reference signal is shifted from the reference signal by a phase difference (phase shift) of 180 degrees. Therefore, the up-slopes of the phase-shifted reference signal correspond to the down-slopes of the reference signal. Accordingly, the signal level of the second analog signal starts to rise continuously and monotonously at respective timings t02, t04, t06, and t08.

As can be seen from the second and third diagrams of FIG. 7A, the first integration value is reset triggered by the down-slopes of the reference signal, and the second integration value is reset triggered by the up-slopes of the reference signal. However, in an alternative embodiment, the resetting of the first integration value may also be triggered by the next up-slope of the reference signal, and the resetting of the second integration value may also be triggered by the next down-slope of the reference signal. In a further alternative embodiment, a trigger for resetting the first integration value is provided at arbitrary timings between the respective down-slopes and the respective subsequent up-slopes of the reference signal, and a trigger for resetting the second integration value is provided at arbitrary timings between the respective up-slopes and the respective subsequent down-slopes of the reference signal.

The first control value is adjusted for each period of the reference signal, as is illustrated in the fourth diagram of FIG. 7A. In the present case, the first control value is adjusted synchronously with the up-slopes of the reference signal and also the second control value is adjusted synchronously with the up-slopes of the reference signal. The first control value, from one period of reference signal to another, is gradually increased by constant amounts, from a level L11 to a level L12 at timing t03, from the level L12 to a level L13 at timing t05, and from the level L13 to a level L14 at timing t07. The second control value, from one period of the reference signal to another, is gradually increased by constant amounts, from a level L21 to a level L22 at timing t03, and from the level L22 to a level L23 at timing t05. In the illustrative example of FIG. 7A, the level L21 is higher than the level L11, the level L22 is higher than the level L12, and the level L23 is higher than the level L13 and so forth, and is particularly chosen to obtain a duty-ratio of the digital output signal of 50% (that is, the respective differences between L21 and L11, L22 and L12, L23 and L13 and so forth are half the constant amount by which the levels are increased from one period of the reference signal to another). However, such a choice for levels L21, L22, and L23 is not mandatory and may be departed from if a different duty-ratio of the digital output signal is desired, or if the duty-ratio of the digital output signal is not of particular concern. Nevertheless, it is understood that the levels L21, L22, and L23 and so forth need to be chosen so that the trigger for the down-slopes of the digital output signal does not overtake the trigger for the up-slopes of the digital output signal.

The continuously and monotonously rising signal level of the first analog signal crosses the threshold indicated by the first control value from below at timing t11 in the first period of the reference signal illustrated in FIG. 7A, at timing t12 in the second period of the reference signal, at timing t13 in the third period of the reference signal, and at timing t14 in the fourth period of the reference signal. The continuously and monotonously rising signal level of the second analog signal crosses the threshold indicated by the second control value from below at timing t21 in the first period of the reference signal illustrated in FIG. 7A, at timing t22 in the second period of the reference signal, and at timing t23 in the third period of the reference signal.

As can be seen from the fourth and fifth diagrams of FIG. 7A, the timing at which the signal level of the first analog signal crosses the threshold indicated by the first control value in each period of the reference signal occurs later than in the previous period of the reference signal, and the timing at which the signal level of the second analog signal crosses the threshold indicated by the second control value in each period of the reference signal occurs later than in the previous period of the reference signal. That is, in FIG. 7A the relations t11–t01<t12–t03<t13–t05<t14–t07 and t21–t01<t22–t03<t23–t05 hold.

As can be seen from the sixth diagram of FIG. 7A, the output of the high level L1 of the digital output signal is triggered by the first analog signal rising above the control value at respective timings t11, t12, t13 and t14. In other words, a subset of switches of the signal level of the digital signal are coincident with a respective sign flip of the determined sign of the first difference between the value of the first analog signal and the threshold indicated by the first control value. More specifically, every other of the switches of the signal level of the digital signal (in the present case all up-slopes of the digital output signal) is coincident with a respective sign flip of the determined sign of the first difference. The output of the low level L0 of the digital output signal is triggered by the second analog signal rising above the threshold indicated by the second control value at respective timings t21, t22, and t23 in FIG. 7A. In other words, the remaining switches of the signal level of the digital output signal (in the present case all down-slopes of the digital output signal) that are not in the above subset of switches are coincident with a respective sign flip of the determined sign of the second difference between the value of the second analog signal and the threshold indicated by the second control value.

As in FIGS. 4A, 4B, the period of the reference signal is denoted by T1, and the period of the digital output signal is denoted by T2. As can be clearly seen from a comparison of the first diagram and the sixth diagram in FIG. 7A, the period T2 of the digital output signal is longer than the period T1 of the reference signal. Accordingly, the frequency Fout of the digital output signal is lower than the frequency Fref of the reference signal. By the specific choice of levels L21, L22, and L23 in FIG. 7A, the duty-ratio of the digital output signal is 50%.

Figure 7B:
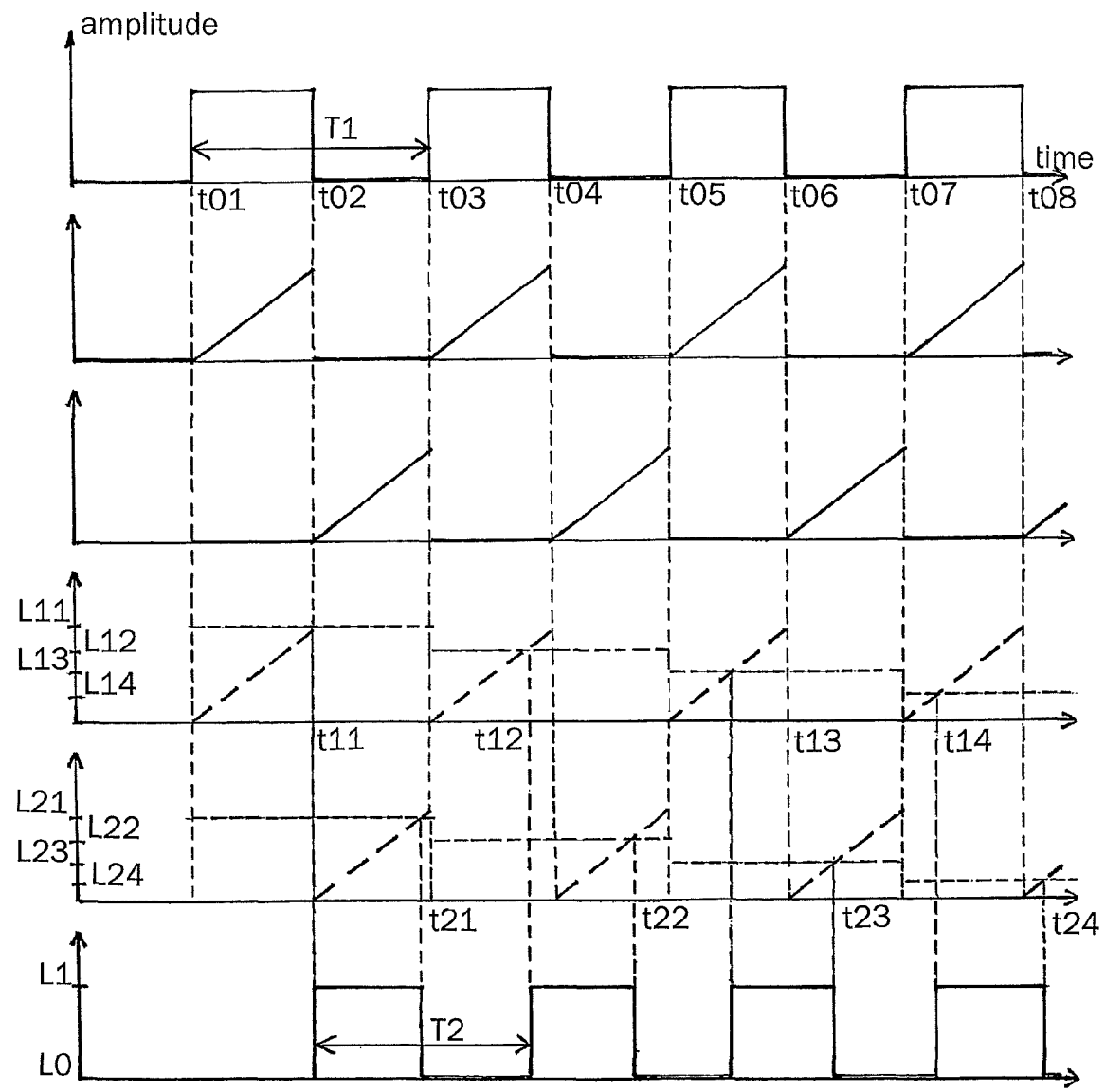
FIG. 7B is another timing diagram illustration the operation of the signal generator according to the second embodiment of the invention.

FIG. 7B is a timing diagram illustrating the operation of the signal generator of FIG. 5 having the first reference branch and the second reference branch, in a case in which the frequency Fout of the digital output signal of the signal generator is higher than the frequency Fref of the reference signal. The first diagram from the top indicates the reference signal, the second diagram indicates the first analog signal, the third diagram indicates the second digital signal, the fourth diagram indicates the operation of the first comparator 202 in FIG. 5, the fifth diagram indicates the operation of the second comparator 302 in FIG. 5, and the sixth diagram indicates the digital output signal of the signal generator of FIG. 5. The first three diagrams are identical to the first three diagrams in FIG. 7A, and analogous explanations apply.

The first control value is adjusted for each period of the reference signal, as is illustrated in the fourth diagram of FIG. 7B. In the present case, the first control value is adjusted synchronously with the up-slopes of the reference signal and also the second control value is adjusted synchronously with the up-slopes of the reference signal. The first control value, from one period of the reference signal to another, is gradually decreased by constant amounts, from a level L11 to a level L12 at timing t03, from the level L12 to a level L13 at timing t05, and from the level L13 to a level L14 at timing t07. Also the second control value, from one period of the reference signal to another, is gradually decreased by the constant amounts, from a level L21 to a level L22 at timing t03, from the level L22 to a level L23 at timing t05, and from the level L23 to a level L24 at timing t07. In the illustrative example of FIG. 7B, the level L21 is lower than the level L11, the level L22 is lower than the level L12, the level L23 is lower than the level L13, the level L24 is lower than the level L14 and so forth, and is particularly chosen to obtain a duty-ratio of the digital output signal of 50% (that is, the respective differences between levels L21 and L11, L22 and L12, L23 and L13, L24 and L14, and so forth are half the constant amount by which the levels are decreased from one period of the reference signal to another). However, such a choice for levels L21, L22, and L23 is not mandatory and may be departed from if a different duty-ratio of the digital output signal is desired, or if the duty-ratio of the digital output signal is not of particular concern. Nevertheless, it is understood that the levels L21, L22, and L23 and so forth need to be chosen so that the trigger for the down-slopes of the digital output signal does not overtake the trigger for the up-slopes of the digital output signal.

The continuously and monotonously rising signal level of the first analog signal crosses the threshold indicated by the first control value from below at timing t11 in the first period of the reference signal illustrated in FIG. 7B, at timing t12 in the second period of the reference signal, at timing t13 in the third period of the reference signal, and at timing t14 in the fourth period of the reference signal. The continuously and monotonously rising signal level of the second analog signal crosses the threshold indicated by the second control value from below at timing t21 in the first period of the reference signal illustrated in FIG. 7B, at timing t22 in the second period of the reference signal, at timing t23 in the third period of the reference signal, and at timing t24 in the fourth period of the reference signal.

As can be seen from the fourth and fifth diagrams of FIG. 7B, the timing at which the signal level of the first analog signal crosses the threshold indicated by the first control value in each period of the reference signal occurs earlier than in the previous period of the reference signal, and the timing at which the signal level of the second analog signal crosses the threshold indicated by the second control value in each period of the reference signal occurs earlier than in the previous period of the reference signal. That is, in FIG. 7B the relations t11−t01>t12−t03>t13−t05>t14−t07 and t21−t01>t22−t03>t23−t05>t24−t07 hold.

As can be seen from the sixth diagram of FIG. 7B, the output of the high level of the digital output signal is triggered by the first analog signal rising above the control value at respective timings t11, t12, t13 and t14. In other words, a subset of switches of the signal level of the digital signal are coincident with a respective sign flip of the determined sign of the first difference between the value of the first analog signal and the threshold indicated by the first control value. More specifically, every other of the switches of the signal level of the digital signal (in the present case all up-slopes of the digital output signal) is coincident with a respective sign flip of the determined sign of the first difference. The output of the low level L0 of the digital output signal is triggered by the second analog signal rising above the threshold indicated by the second control value at respective timings t21, t22, t23, and t24 in FIG. 7B. In other words, the remaining switches of the signal level of the digital output signal (in the present case all down-slopes of the digital output signal) that are not in the above subset of switches, are coincident with a respective sign flip of the determined sign of the second difference between the value of the second analog signal and the threshold indicated by the second control value.

As in FIGS. 4A, 4B and 7A, the period of the reference signal is denoted by T1, and the period of the digital output signal is denoted by T2. As can be clearly seen from a comparison of the first diagram and the sixth diagram in FIG. 7B, the period T2 of the digital output signal is shorter than the period T1 of the reference signal. Accordingly, the frequency Fout of the digital output signal is higher than the frequency Fref of the reference signal. By the specific choice of levels L21, L22, L23 and L24 in FIG. 7B, the duty-ratio of the digital output signal is 50%.

For procedures to be performed in case of an overflow or an underflow it is referred to the respective explanations in connection with FIGS. 4A and 4B. Likewise, also the determination of the constant amount ΔC by which the first control level control has to be changed for each period of the reference signal has been described with reference to FIGS. 4A and 4B. If a constant duty ratio is desired, the first control level and the second control level have to be changed by the same constant amount for each period of the reference signal, that is, the constant change amount ΔC1 for the first control level has to be equal to the constant change amount ΔC2 for the second control level.

Figure 8:
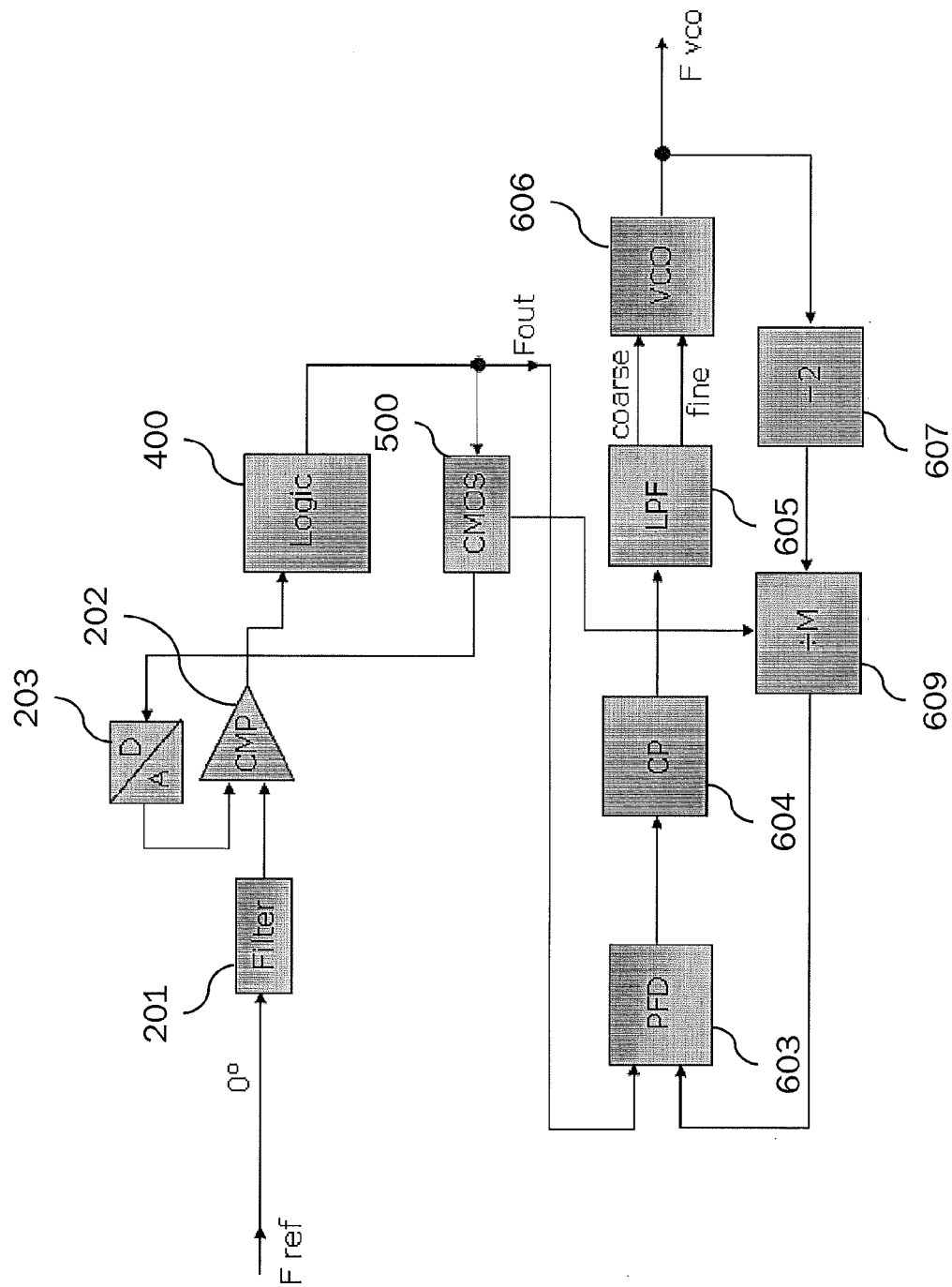
FIG. 8 illustrates a fractional-N frequency synthesizer comprising the signal generator according to the first embodiment of the invention.

FIG. 8 illustrates a fractional-N frequency synthesizer comprising the signal generator described with reference to FIGS. 2, 3, 4A, and 4B. The fractional-N frequency synthesizer comprises a phase frequency detector (PFD) 603, a charge pump 604, a loop filter 605, a voltage controlled oscillator (VCO) 606, a divide-by-2 pre-scaler 607, and an M-counter 609 serving as fractional-N divider. In this respect, the fractional-N frequency synthesizer illustrated in FIG. 8 corresponds to the prior art fractional-N frequency synthesizer illustrated in FIG. 1.

Figure 1:
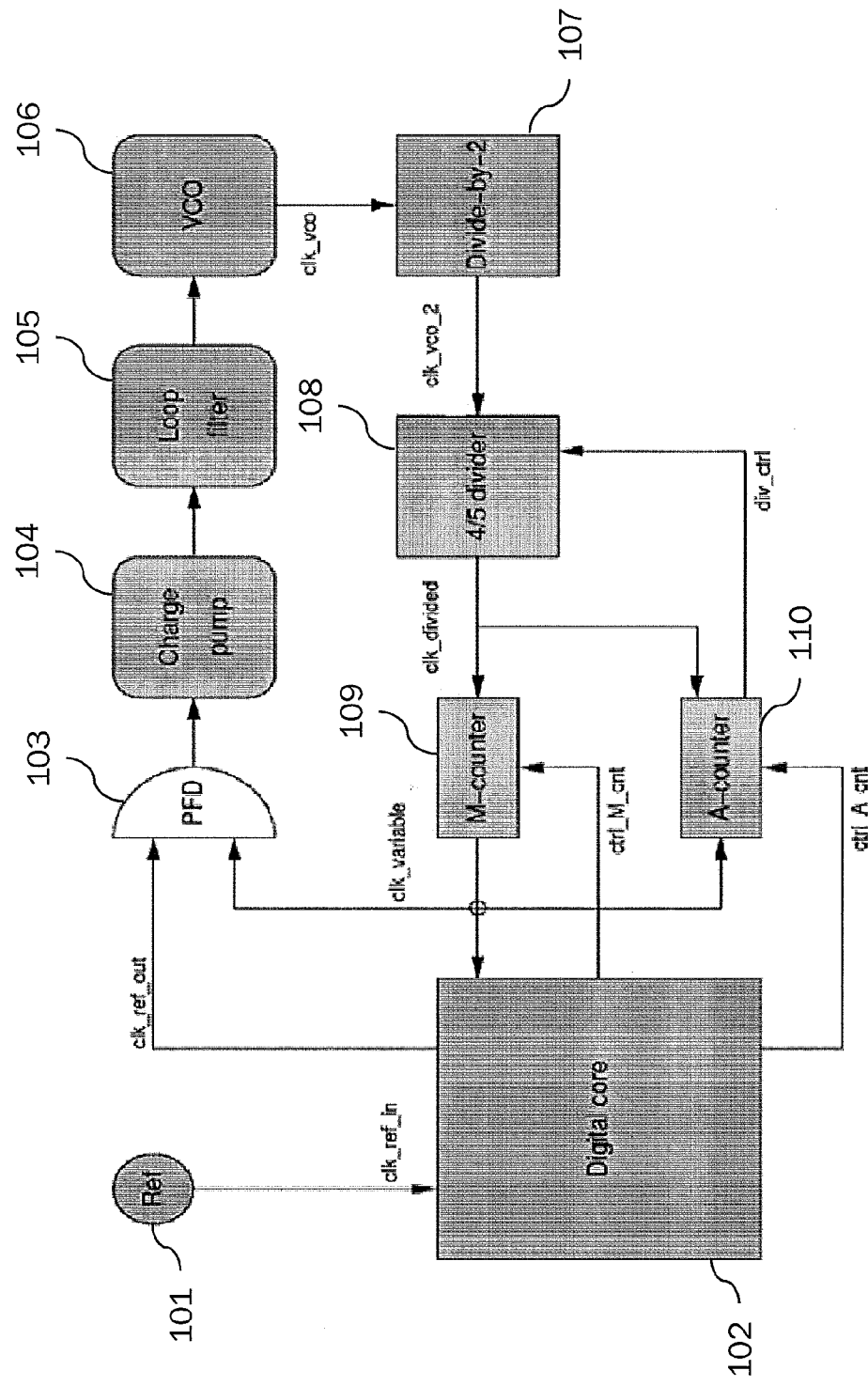
FIG. 1 illustrates a fractional-N frequency synthesizer known in the state of the art.

However, the fractional-N frequency synthesizer in FIG. 8 is different from the prior art fractional-N frequency synthesizer in that the controller 500 of the signal generator is connected to the fractional-N divider 609, so that the fractional-N divider 609 is controlled by the controller 500, instead of by the digital core 102 in FIG. 1. Moreover, the reference clock signal for the fractional-N frequency synthesizer in FIG. 8 is provided by the signal generator according the first embodiment of the invention, instead of by the reference clock generator 101 in FIG. 1. The controller 500 controls the fractional-N divider 609 to set a resulting/desired division ratio N, and also, as discussed with reference to FIGS. 2, 3, 4A, and 4B, provides a digital sequence to the digital-to-analog converter 203 indicating a control value, for each period of the reference signal Fref. In this sense, the fractional-N frequency synthesizer of FIG. 8 belongs to the class of hybrid fractional-N frequency synthesizers.

Figure 9:
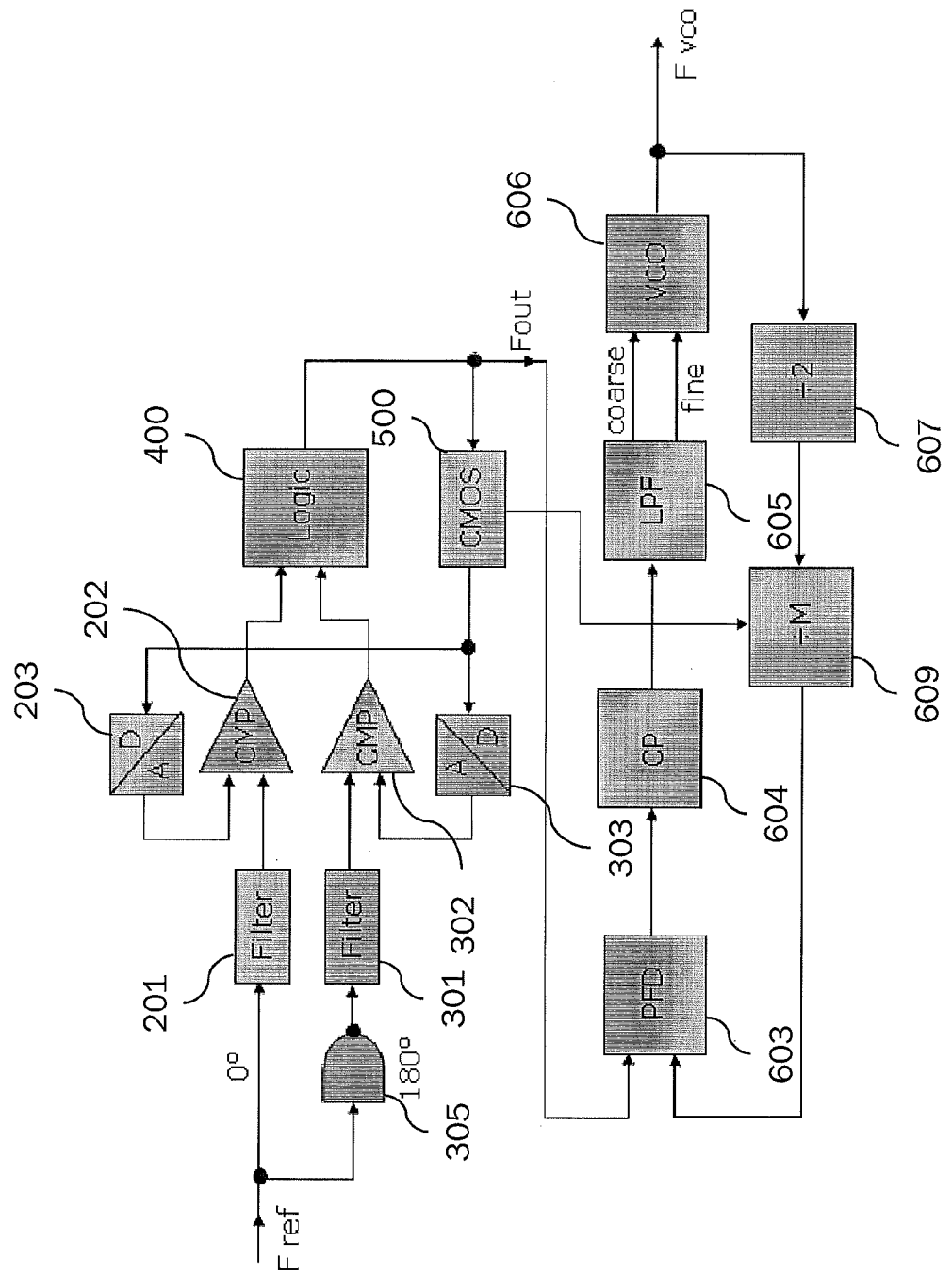
FIG. 9 illustrates a fractional-N PLL frequency synthesizer comprising the signal generator according to the second embodiment of the invention.

FIG. 9 illustrates a fractional-N frequency synthesizer comprising the signal generator described with reference to FIGS. 5, 6A, 6B, 6C, 7A, and 7B. The fractional-N frequency synthesizer comprises a phase frequency detector (PFD) 603, a charge pump 604, a loop filter 605, a voltage controlled oscillator (VCO) 606, a divide-by-2 pre-scaler 607, and an M-counter 609 serving as fractional-N divider. In this respect, the fractional-N frequency synthesizer illustrated in FIG. 9 corresponds to the prior art fractional-N frequency synthesizer illustrated in FIG. 1.

However, the fractional-N frequency synthesizer in FIG. 9 is different from the prior art fractional-N frequency synthesizer in that the controller 500 of the signal generator is connected to the fractional-N divider 609, so that the fractional-N divider 609 is controlled by the controller 500, instead of by the digital core 102 in FIG. 1. Moreover, the reference clock signal for the fractional-N frequency synthesizer in FIG. 9 is provided by the signal generator according to the second embodiment of the invention, instead of by the reference clock generator 101 in FIG. 1. The controller 500 controls the fractional-N divider 609 to set a resulting/desired division ratio N, and also, as discussed with reference to FIGS. 5, 6A, 6B, 6C, 7A, and 7B, provides digital sequences indicating control values to the digital-to-analog converters 203 and 303, for each period of the reference signal Fref. In this sense, the fractional-N frequency synthesizer of FIG. 9 belongs to the class of hybrid fractional-N frequency synthesizers.

Figure 10:
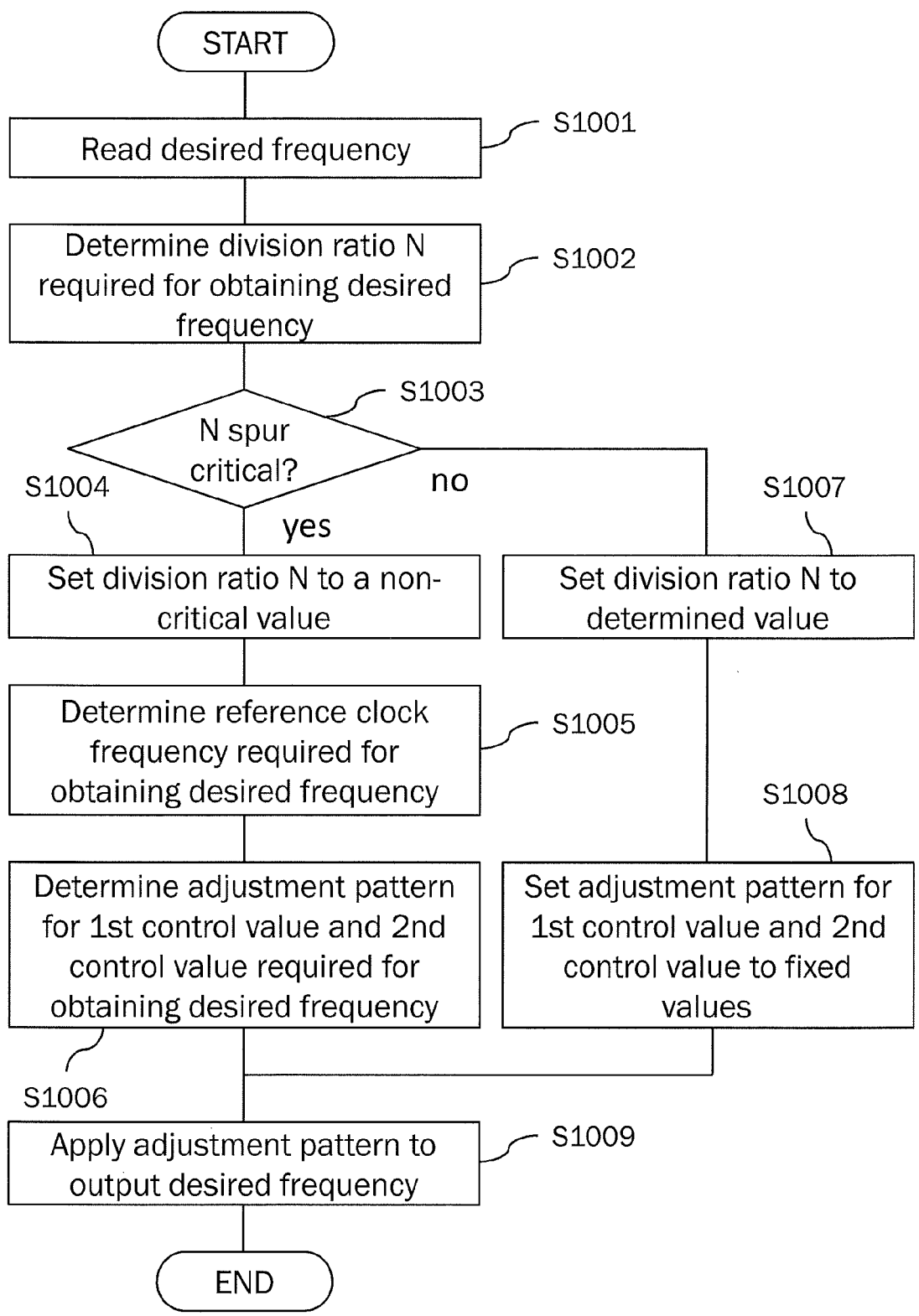
FIG. 10 is a flowchart illustrating the operation of the fractional-N frequency synthesizers shown in FIG. 8 and FIG. 9.

FIG. 10 is a flowchart illustrating the operation of the fractional-N frequency synthesizers shown in FIGS. 8 and 9. At step S1001, a desired frequency FVCO of the fractional-N frequency synthesizer, or correspondingly of the VCO 606, is read. The desired frequency of the digital output signal of the fractional-N frequency synthesizer may be input by a user or by a higher level control means controlling the fractional-N frequency synthesizer. At step S1002, a fractional division ratio N that would be required for obtaining the desired frequency, if a reference clock signal of frequency Fref would be used is determined. At step S1003, it is checked whether the determined fractional division ratio N is a spur-critical division ratio, that is, whether the determined fractional division ratio N is either close to an integer division ratio or to a half-integer division ratio. If it is found that the determined fractional division ratio N is spur-critical, the process flow proceeds to step S1004, otherwise it proceeds to step S1007.

At step S1004, the division ratio N is set to a value that is not spur-critical. For instance, the division ratio N may be set to the nearest integer that is larger than the determined fractional division ratio N. Generally, setting the division ratio N to higher values than the determined fractional division ratio N is preferred over setting the division ratio N to values lower than the determined fractional division ratio N. The reason is that in the former case a reference clock frequency Fout smaller than the frequency Fref may be employed, while in the latter case a reference clock frequency Fout larger than the reference frequency Fref is required. However, in the latter case the problem may occur that digital circuitry may not be able to appropriately process a signal of frequency Fout which is larger than the frequency Fref.

At step S1005, a reference clock frequency Fout that is required for obtaining the desired frequency of the digital output signal of the fractional-N frequency synthesizer for the division ratio N set at step S1004 is determined. At step S1006, an adjustment pattern for the first control value and/or the second control value that would be required for obtaining the reference clock frequency determined at step S1005 as the frequency of the digital output signal of the signal generator is determined. This step is carried out in accordance with the description provided with reference to FIGS. 4A, 4B, 7A, and 7B. Accordingly, determining the adjustment pattern involves determining the constant amount ΔC by which the first control value and/or the second control value are increased or decreased for each period of the reference signal.

At step S1007, if it is found at step S1003 that the determined fractional division ratio N is not spur-critical, the division ratio N of the fractional-N divider 609 is set to the determined value. Accordingly, the output frequency Fout of the signal generator may be kept identical to the reference frequency Fref. Therefore, in step S1008, the adjustment pattern for the first control value and/or the second control value is set to fixed values, that is the constant amount ΔC is set to zero. According to this adjustment pattern, the first control value and/or the second control value are kept constant, so that the reference clock signal output by the signal generator has the same frequency and duty-ratio as the reference signal Fref.

At step S1009, the adjustment pattern determined at steps S1006 or S1008 is applied, so that the controller 500 adjusts the first control value and/or the second control value for each period of the reference signal Fref in accordance with the determined adjustment pattern. In the above, it is understood that for the fractional-N frequency synthesizer of FIG. 8 an adjustment pattern for the first control value only is determined and set.

If during operation of the fractional-N frequency synthesizer a different frequency of the digital output signal of the fractional-N frequency synthesizer is desired, the process flow of FIG. 10 is repeated.

Features, components and specific details of the structures of the above-described embodiments may be exchanged or combined to form further embodiments optimized for the respective application. As far as those modifications are readily apparent for an expert skilled in the art, they shall be disclosed implicitly by the above description without specifying explicitly every possible combination, for the sake of conciseness of the present description.

What is claimed is:

1. A method for generating a digital signal of tunable frequency, the method comprising:
   generating a periodic first analog signal;
   determining a sign of a first difference between a value of the first analog signal and a first control value to determine sign flips, wherein the first control value is a variable value; and
   generating the digital signal of tunable frequency on the basis of the determined sign of the first difference, wherein the digital signal of tunable frequency is generated such that a subset of switches of a signal level of the digital signal of tunable frequency are coincident with a respective sign flip of the determined sign of the first difference.

2. The method according to claim 1, further comprising:
   adjusting the first control value for each period of the first analog signal.

3. The method according to claim 1, wherein
   generating the first analog signal further comprises periodically performing a first integration operation to obtain a first integration value; and
   the first analog signal is indicative of the first integration value.

4. The method according to claim 1, wherein in the step of generating the digital signal of tunable frequency, the digital signal of tunable frequency is further generated such that each of the remaining switches of the signal level of the digital signal of tunable frequency is performed a predetermined period of time after a respective opposite switch of the signal level of the digital signal of tunable frequency.

5. The method according to claim 1, further comprising:
   generating a periodic second analog signal, wherein the second analog signal has a fixed phase shift with respect to the first analog signal; and
   determining a sign of a second difference between a value of the second analog signal and a second control value to determine sign flips, wherein the second control value is a variable value,
   wherein in the step of generating the digital signal of tunable frequency, the digital signal of tunable frequency is further generated on the basis of the determined sign of the second difference such that each of the remaining switches of the signal level of the digital signal of tunable frequency are coincident with a respective sign flip of the determined sign of the second difference.

6. The method according to claim 5, further comprising:
   adjusting the second control value for each period of the first analog signal.

7. The method according to claim 5, wherein
   generating the second analog signal further comprises periodically performing a second integration operation to obtain a second integration value; and
   the second analog signal is indicative of the second integration value.

8. The method according to claim 1, further comprising:
   using the digital signal of tunable frequency as a reference clock signal for a frequency synthesizer, the frequency synthesizer comprising:
   a voltage controlled oscillator for generating an output signal;
   a fractional-N divider for generating a divided output signal on the basis of the output signal;
   a phase comparator for generating a control signal indicative of a phase difference between the divided output signal and the reference clock signal; and
   a filter for generating a filtered control signal on the basis of the control signal, wherein the voltage controlled oscillator is controlled on the basis of the filtered control signal.

9. The method according to claim 8, further comprising:
setting a division ratio of the fractional-N divider; and
controlling the frequency of the digital signal of tunable frequency in accordance with a desired frequency of the output signal and the set division ratio of the fractional-N divider.

10. A signal generator for generating a digital signal of tunable frequency, the signal generator comprising:
means for generating a periodic first analog signal;
means for determining a sign of a first difference between a value of the first analog signal and a first control value to determine sign flips, wherein the first control value is a variable value; and
means for generating the digital signal of tunable frequency on the basis of the determined sign of the first difference, configured to switch a signal level of the digital signal of tunable frequency such that a subset of switches of the signal level of the digital signal of tunable frequency are coincident with a respective sign flip of the determined sign of the first difference.

11. The signal generator according to claim 10, further comprising:
means for adjusting the first control value for each period of the first analog signal.

12. The signal generator according to claim 10, wherein
the means for generating the first analog signal is further configured to periodically perform a first integration operation to obtain a first integration value; and
the first analog signal is indicative of the first integration value.

13. The signal generator according to claim 10, further comprising:
means for generating a periodic second analog signal, wherein the second analog signal has a fixed phase shift with respect to the first analog signal; and
means for determining a sign of a second difference between a value of the second analog signal and a second control value to determine sign flips, wherein the second control value is a variable value,
wherein the means for generating the digital signal of tunable frequency is further configured to generate the digital signal of tunable frequency on the basis of the determined sign of the second difference, and to switch the signal level of the digital signal of tunable frequency such that each of the remaining switches of the signal level of the digital signal of tunable frequency are coincident with a respective sign flip of the determined sign of the second difference.

14. A frequency synthesizer comprising:
a voltage controlled oscillator for generating an output signal;
a fractional-N divider for generating a divided output signal on the basis of the output signal;
a phase comparator for generating a control signal indicative of a phase difference between the divided output signal and a reference clock signal;
a filter for generating a filtered control signal on the basis of the control signal, wherein the voltage controlled oscillator is controlled on the basis of the filtered control signal; and
the signal generator according to claim 10,
wherein the reference clock signal is the digital signal of adjustable frequency generated by the signal generator.

15. The frequency synthesizer according to claim 14, further comprising:
means for setting a division ratio of the fractional-N divider; and
means for controlling the frequency of the digital signal of tunable frequency in accordance with a desired frequency of the output signal and the set division ratio of the fractional-N divider.

16. A signal generator for generating a digital signal of tunable frequency, the signal generator comprising:
a first filter that outputs a periodic first analog signal;
a comparator that determines a sign of a first difference between a value of the first analog signal and a first control value to determine sign flips, wherein the first control value is a variable value; and
circuitry that generates the digital signal of tunable frequency on the basis of the determined sign of the first difference, configured to switch the signal level of the digital signal of tunable frequency such that a subset of switches of a signal level of the digital signal of tunable frequency are coincident with a respective sign flip of the determined sign of the first difference.

17. The signal generator according to claim 16, further comprising:
a controller that adjusts the first control value for each period of the first analog signal.

18. The signal generator according to claim 16, wherein
the first filter that generates the first analog signal is further configured to periodically perform a first integration operation to obtain a first integration value, and
the first analog signal is indicative of the first integration value.

19. The signal generator according to claim 16, further comprising:
a second filter that generates a periodic second analog signal, wherein the second analog signal has a fixed phase shift with respect to the first analog signal; and
a second comparator that determines a sign of a second difference between a value of the second analog signal and a second control value to determine sign flips, wherein the second control value is a variable value,
wherein the circuitry that generates the digital signal of tunable frequency is further configured to generate the digital signal of tunable frequency on the basis of the determined sign of the second difference, and to switch the signal level of the digital signal of tunable frequency such that each of the remaining switches of the signal level are coincident with a respective sign flip of the determined sign of the second difference.

20. A frequency synthesizer comprising:
a voltage controlled oscillator for generating an output signal;
a fractional-N divider for generating a divided output signal on the basis of the output signal;
a phase comparator for generating a control signal indicative of a phase difference between the divided output signal and a reference clock signal;
a filter for generating a filtered control signal on the basis of the control signal, wherein the voltage controlled oscillator is controlled on the basis of the filtered control signal; and
the signal generator according to claim 16,
wherein the reference clock signal is the digital signal of tunable frequency generated by the signal generator.

* * * * *